(12) United States Patent
Byeon

(10) Patent No.: US 8,179,737 B2
(45) Date of Patent: May 15, 2012

(54) SEMICONDUCTOR MEMORY APPARATUS

(75) Inventor: Sang Jin Byeon, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 459 days.

(21) Appl. No.: 12/431,981

(22) Filed: Apr. 29, 2009

(65) Prior Publication Data
US 2010/0097877 A1    Apr. 22, 2010

(30) Foreign Application Priority Data

Oct. 21, 2008   (KR) .................... 10-2008-0103290

(51) Int. Cl.
*G11C 5/04* (2006.01)

(52) U.S. Cl. ............. 365/226; 365/191; 365/210.12; 365/230.06

(58) Field of Classification Search ................ 365/226, 365/227, 228, 229
See application file for complete search history.

(56) References Cited

U.S. PATENT DOCUMENTS

| | | | |
|---|---|---|---|
| 6,191,994 B1 * | 2/2001 | Ooishi | 365/226 |
| 6,385,124 B2 * | 5/2002 | Ooishi | 365/230.06 |
| 6,549,484 B2 | 4/2003 | Morita et al. | |
| 8,004,894 B2 * | 8/2011 | Kondo | 365/185.11 |
| 2005/0116765 A1 * | 6/2005 | Sakiyama et al. | 327/534 |

FOREIGN PATENT DOCUMENTS

| | | |
|---|---|---|
| KR | 100650847 B1 | 11/2006 |
| KR | 1020070069279 A | 7/2007 |

* cited by examiner

*Primary Examiner* — Pho M Luu
(74) *Attorney, Agent, or Firm* — IP & T Group LLP

(57) ABSTRACT

A semiconductor memory apparatus includes an internal circuit configured to be driven by current flowing between first and second voltage nodes, and a current control unit configured to control an amount of the current in response to an operational-speed information signal.

32 Claims, 10 Drawing Sheets 230-6, 230-7

SEMICONDUCTOR MEMORY APPARATUS

CROSS-REFERENCES TO RELATED APPLICATION

The present application claims priority under 35 U.S.C. 119(a) to Korean application number 10-2008-0103290, filed on Oct. 21, 2008, in the Korean Patent Office, which is incorporated by reference in its entirety as if set forth herein in full.

BACKGROUND OF THE INVENTION

1. Technical Field

The embodiments described herein relate to a semiconductor integrated circuit, and, more particularly, to a semiconductor memory apparatus.

2. Related Art

In general, a semiconductor memory apparatus operates by receiving an external voltage. In addition, all internal circuits constituting the semiconductor memory apparatus operate by receiving the external voltage.

As shown in FIG. 1, the semiconductor memory apparatus may include an internal circuit 10, a first voltage supply 20, and a second voltage supply 30.

The internal circuit 10 operates due to a voltage difference between a first voltage node node_1 and a second voltage node node_2.

If an inverted enable signal 'enb' is enabled at a low level, the first voltage supply 20 applies an external voltage VDD to the first voltage node node_1.

The first voltage supply 20 includes a first transistor P1. The first transistor P1 includes a gate receiving the inverted enable signal 'enb', a source receiving the external voltage VDD, and a drain connected to the first voltage node node_1.

If an enable signal 'en' is enabled at a high level, the second voltage supply 30 applies a ground voltage VSS to the second voltage node node_2.

The second voltage supply 30 includes a second transistor N1. The second transistor N1 includes a gate receiving the enable signal 'en', a drain connected to the second voltage node node_2, and a source receiving the ground voltage VSS. In this case, the inverted enable signal 'enb' has a phase opposite to that of the enable signal 'en'.

Hereinafter, the operation of the semiconductor memory apparatus having the above structure will be described.

If the inverted enable signal 'enb' is enabled, the first supply voltage 20 applies the external voltage VDD to the first voltage node node_1 of the internal circuit 10.

If the enable signal 'en' is enabled, the second voltage supply 30 applies the ground voltage VSS to the second voltage node node_2 of the internal circuit 10.

The internal circuit 10 is driven by internal current flowing due to a voltage difference between the first voltage node node_1 and the second voltage node node_2.

The typical semiconductor memory apparatus uniformly maintains an amount of current flowing through the internal circuit 10.

If the operational speed of the internal circuit 10 becomes fast, a greater amount of current is consumed. If the operational speed of the internal circuit 10 becomes lowered, a smaller amount of current is consumed. However, in the typical semiconductor memory apparatus, an optimum current is always set for the internal circuit 10 to enable the internal circuit 10 to operate at the maximum speed. This is necessary for allowing the semiconductor memory apparatus to perform both high and low speed-operations.

Accordingly, when the typical semiconductor memory apparatus operates at a low speed, current may be wasted.

SUMMARY

A semiconductor memory apparatus capable of controlling an amount of current flowing through an internal circuit according to operational speeds is described herein.

According to one aspect, a semiconductor memory apparatus includes an internal circuit configured to be driven by current flowing between first and second voltage nodes, and a current control unit configured to control an amount of the current in response to an operational-speed information signal.

According to another aspect, a semiconductor memory apparatus includes an internal circuit configured to operate if driving voltage is applied to a voltage node, and a current control unit including a plurality of transistors having different sizes, and configured to apply the driving voltage to the voltage node by selectively turning on one of the transistors that has a larger size than a previously selected one of the transistors as an operational speed of the semiconductor memory apparatus is increased.

According to another aspect, a semiconductor memory apparatus includes an internal circuit configured to operate if driving voltage is applied through at least one voltage node, and a current control unit including a plurality of transistors, and configured to apply the driving voltage to the voltage node by increasing a number of transistors that are turned on among the plurality of transistors as an operational speed of the semiconductor memory apparatus is increased.

According to another aspect, a semiconductor memory apparatus includes an internal circuit configured to operate by current flowing through at least one voltage node, a control signal generating unit configured to determine a voltage level of a control signal in response to an operational speed of the semiconductor memory apparatus, and a switch configured to control an amount of the current in response to the voltage level of the control signal.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

A semiconductor memory apparatus according to the present disclosure includes an internal circuit operating by current flowing between first and second voltage nodes and a current control unit controlling an amount of the current in response to operational-speed information signals.

Figure 1:
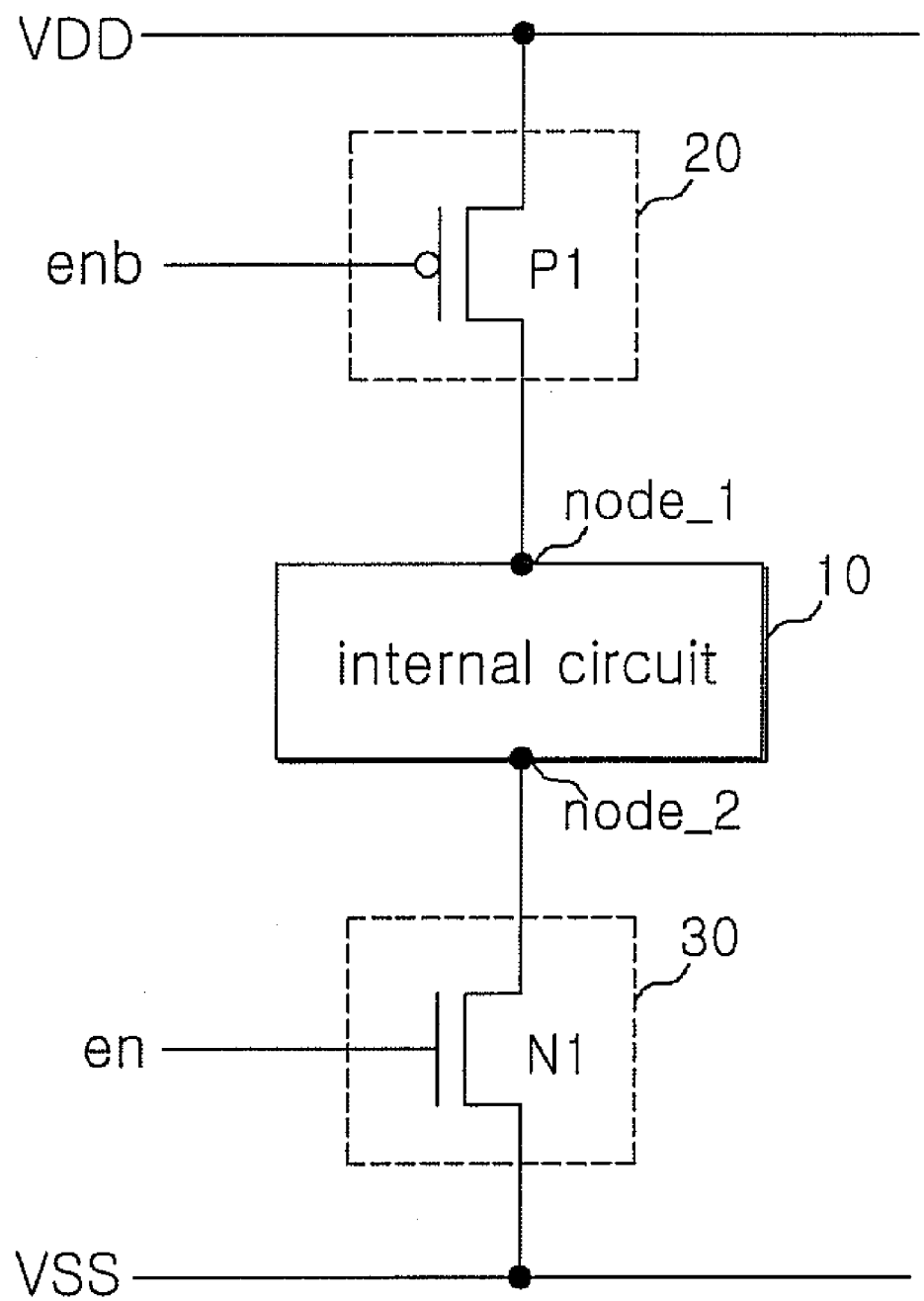
FIG. 1 is a circuit diagram showing a structure of a typical semiconductor memory apparatus.
Figure 2A:
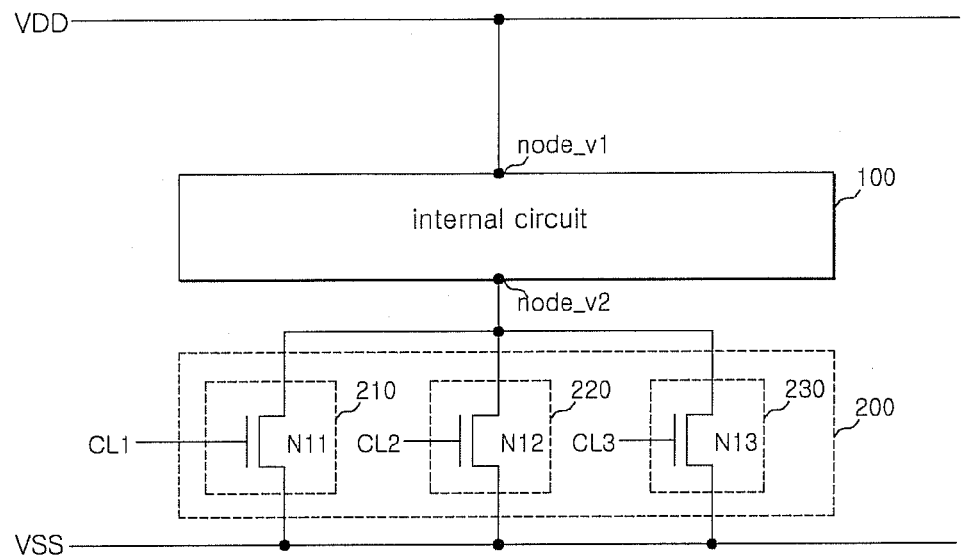
FIGS. 2A and 2B are circuit diagrams each showing an example of a structure of a semiconductor memory apparatus according to embodiments of the present disclosure.

As shown in FIG. 2A, a semiconductor memory apparatus according to an embodiment of the present disclosure includes an internal circuit 100 and a current control unit 200.

The internal circuit 100 operates by current flowing between first and second voltage nodes node_v1 and node_v2. In this case, the first voltage node node_v1 is connected to a line of an external voltage VDD.

The current control unit 200 controls an amount of the current in response to operational-speed information signals 'CL1', 'CL2', and 'CL3'.

When a mode register set (MRS) is set by a controller provided outside of the semiconductor memory apparatus, the operational speed of the semiconductor memory apparatus is set. The operational-speed information signals 'CL1', 'CL2', and 'CL3' may be output signals from the MRS. In this case, the operational-speed information signals 'CL1', 'CL2', and 'CL3' correspond to CAS latency signals. In addition, the operational-speed information signals 'CL1', 'CL2', and 'CL3' may be generated by detecting a frequency of a clock applied to the semiconductor memory apparatus.

In order to clearly distinguish the operational-speed information signals 'CL1', 'CL2', and 'CL3' from each other, the operational-speed information signals 'CL1', 'CL2', and 'CL3' will be referred to as first to third operational-speed information signals 'CL1', 'CL2', and 'CL3', respectively, below. When the semiconductor memory apparatus operates at the lowest speed, the first operational-speed information signal 'CL1' is enabled. When the semiconductor memory apparatus operates at the highest speed, the third operational-speed information signal 'CL3' is enabled. When the semiconductor memory apparatus operates at an intermediate speed between the highest speed and the lowest speed, the second operational-speed information signal 'CL2' is enabled. Although the present disclosure has been described in that the semiconductor memory apparatus operates at three types of operational speeds, the present disclosure is not limited thereto.

The current control unit 200 includes first to third switches 210 to 230.

If the first operational-speed information signal 'CL1' is enabled, the first switch 210 connects the second voltage node node_v2 with a line of the ground voltage 'VSS'.

The first switch 210 includes a first transistor N11. The first transistor N11 includes a gate receiving the first operational-speed information signal 'CL1', and a drain and a source connected to the second voltage node node_v2 and the line of the ground voltage VSS.

If the second operational-speed information signal 'CL2' is enabled, the second switch 220 connects the second voltage node node_v2 with the line of the ground voltage 'VSS'.

The second switch 220 includes a second transistor N12. The second transistor N12 includes a gate receiving the second operational-speed information signal 'CL2', and a drain and a source connected to the second voltage node node_v2 and the line of the ground voltage VSS.

If the third operational-speed information signal 'CL3' is enabled, the third switch 230 connects the second voltage node node_v2 with the line of the ground voltage 'VSS'.

The third switch 230 includes a third transistor N13. The third transistor N13 includes a gate receiving the third operational-speed information signal 'CL3', and a drain and a source connected to the second voltage node node_v2 and the line of the ground voltage VSS. In this case, the first transistor N11 has the smallest size, and the third transistor N13 has the greatest size. The second transistor N12 has a middle size of the sizes of the first and third transistors N11 and N13.

Hereinafter, the operation of the semiconductor memory apparatus having the above structure according to an embodiment of the present disclosure will be described.

When the semiconductor memory apparatus operates at the lowest speed, only the first operational-speed information signal 'CL1' is enabled among the first to third operational-speed information signals 'CL1', 'CL2', and 'CL3'.

If only the first operational-speed information signal 'CL1' is enabled, only the first switch 210 among the first to third switches 210 to 230 is turned on.

Accordingly, the first voltage node node_V1 is connected to the line of the external voltage VDD, and the second voltage node node_V2 is connected to the line of the ground voltage VSS through the first switch 210.

When the semiconductor memory apparatus operates at the second highest speed, only the second operational-speed information signal 'CL2' is enabled among the first to third operational-speed information signals 'CL1', 'CL2', and 'CL3'.

If only the second operational-speed information signal 'CL2' is enabled, only the second switch 220 among the first to third switches 210 to 230 is turned on.

Accordingly, the first voltage node node_v1 is connected to the power supply line of the external voltage VDD, and the second voltage node node_v2 is connected to the ground voltage line of the ground voltage VSS through the second switch 220.

When the semiconductor memory apparatus operates at the highest speed, only the third operational-speed information signal 'CL3' is enabled among the first to third operational-speed information signals 'CL1', 'CL2', and 'CL3'.

If only the third operational-speed information signal 'CL3' is enabled, only the third switch 230 among the first to third switches 210 to 230 is turned on.

Accordingly, the first voltage node node_v1 is connected to the line of the external voltage VDD, and the second voltage node node_v2 is connected to the line of the ground voltage VSS through the third switch 230.

When the semiconductor memory apparatus operates at the lowest speed, the internal circuit 100 is connected to the line of the ground voltage VSS through a transistor having the smallest size, so that an amount of current flowing from the internal circuit 100 to the line of the ground voltage VSS is smaller as compared with a case in which the semiconductor memory apparatus operates at the second highest speed.

When the semiconductor memory apparatus operates at the second highest speed, the internal circuit 100 is connected to the line of the ground voltage VSS through a transistor having the second largest size, so that an amount of current flowing from the internal circuit 100 to the line of the ground voltage VSS is smaller as compared with a case in which the semiconductor memory apparatus operates at the highest speed.

When the semiconductor memory apparatus operates at the highest speed, the internal circuit 100 is connected to the line of the ground voltage VSS through a transistor having the largest size, so that the greatest amount of current flows between the internal circuit 100 and the line of the ground voltage VSS. In this case, the current control unit shown in FIG. 2A controls an amount of current flowing from the internal circuit 100 to the line of the ground voltage VSS to serve as a current sink unit.

The semiconductor memory apparatus according to an embodiment of the present disclosure selectively can turn on a plurality of transistors having different sizes according to operational-speed information signals to control an amount of current used in the internal circuit 100 according to operational speeds of the semiconductor memory apparatus.

Accordingly, the semiconductor memory apparatus according to an embodiment of the present disclosure can control an amount of current used in the internal circuit 100 according to operational speeds of the semiconductor memory apparatus to reduce current consumption of the semiconductor memory apparatus.

Figure 2B:
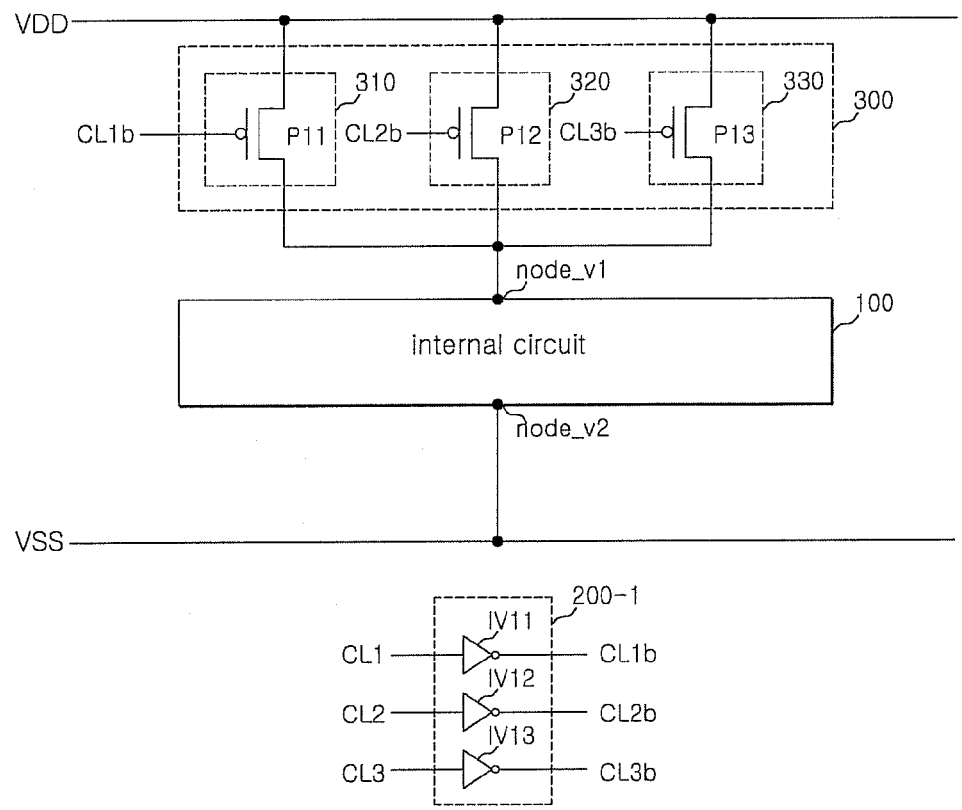

As shown in FIG. 2B, a semiconductor memory apparatus according to another embodiment of the present disclosure includes an internal circuit 100, a signal inverting unit 200-1, and a current control unit 300.

The internal circuit 100 operates by current flowing between first and second voltage nodes node_v1 and node_v2. In this case, the second voltage node node_v2 is connected to a line of the ground voltage VSS.

The signal inverting unit 200-1 inverts first to third operational-speed information signals 'CL1', 'CL2', and 'CL3' to generate first to third inverted operational-speed information signals 'CL1b', 'CL2b', and 'CL3b'.

The signal inverting unit 200-1 includes first to third inverters IV11, IV12, and IV13. The first inverter IV11 receives the first operational-speed information signal 'CL1' to output the first inverted operational-speed information signal 'CL1b'. The second inverter IV12 receives the second operational-speed information signal 'CL2' to output the second inverted operational-speed information signal 'CL2b'. The third inverter IV13 receives the third operational-speed information signal 'CL3' to output the third inverted operational-speed information signal 'CL3b'.

The current control unit 300 controls the amount of current in response to the first to third inverted operational-speed information signals 'CL1b', 'CL2b', and 'CL3b'.

The current control unit 300 includes first to third switches 310 to 330.

If the first inverted operational-speed information signal 'CL1b' is enabled, the first switch 310 connects the first voltage node node_v1 with a line of the external voltage VDD.

The first switch 310 includes a first transistor P11. The first transistor P11 includes a gate receiving the first inverted operational-speed information signal 'CL1b', and a drain and a source connected to the first voltage node node_v1 and the line of the external voltage VDD, respectively.

If the second inverted operational-speed information signal 'CL2b' is enabled, the second switch 320 connects the first voltage node node_v1 with the line of the external voltage VDD.

The second switch 320 includes a second transistor P12. The second transistor P12 includes a gate receiving the second inverted operational-speed information signal 'CL2b', and a drain and a source connected to the first voltage node node_v1 and the line of the external voltage VDD, respectively.

If the third inverted operational-speed information signal 'CL3b' is enabled, the third switch 330 connects the first voltage node node_v1 with the line of the external voltage VDD.

The third switch 330 includes a third transistor P13. The third transistor P13 includes a gate receiving the third inverted operational-speed information signal 'CL3b', and a drain and a source connected to the first voltage node node_v1 and the line of the external voltage VDD, respectively. In this case, the first transistor P11 has the smallest size. The second transistor P12 is larger than the first transistor P11, and the third transistor P13 has the largest size.

Hereinafter, the operation of the semiconductor memory apparatus having the above structure according to another embodiment of the present disclosure will be described.

When the semiconductor memory apparatus operates at the lowest speed, only the first operational-speed information signal CL1 among the first to third operational-speed information signals CL1 to CL3 is enabled. On the other hand, if the first to third operational-speed information signals CL1 to CL3 are enabled at a high level, the first to third inverted operational-speed information signals CL1b to CL3b corresponding to the first to third operational-speed information signals CL1 to CL3 are enabled at a low level, so that the first to third switches 310 to 330 are turned on.

If only the first operational-speed information signal CL1 is enabled, only the first switch 310 among the first to third switches 310 to 330 is turned on.

The first voltage node node_v1 is connected to the line of the external voltage VDD through the first switch 310, and the second voltage node node_v2 is connected to the line of the ground voltage VSS.

When the semiconductor memory apparatus operates at the second highest speed, only the second operational-speed information signal CL2 among the first to third operational-speed information signals CL1 to CL3 is enabled.

If only the second operational-speed information signal CL2 is enabled (for example, turned high in this case), only the second switch 320 among the first to third switches 310 to 330 is turned on.

The first voltage node node_v1 is connected to the line of the external voltage VDD through the second switch 320, and the second voltage node node_v2 is connected to the line of the ground voltage VSS.

When the semiconductor memory apparatus operates at the highest speed, only the third operational-speed information signal CL3 among the first to third operational-speed information signals CL1 to CL3 is enabled.

If only the third operational-speed information signal CL3 is enabled, only the second switch 330 among the first to third switches 310 to 330 is turned on.

The first voltage node node_v1 is connected to the line of the external voltage VDD through the third switch 330, and the second voltage node node_v2 is connected to the line of the ground voltage VSS.

When the semiconductor memory apparatus operates at the lowest speed, the internal circuit 100 is connected to the line of the external voltage VDD through the smallest transistor, so that an amount of current supplied to the internal circuit 100 is smaller as compared with a case in which the semiconductor memory apparatus operates at the second highest speed.

When the semiconductor memory apparatus operates at the second highest speed, the internal circuit 100 is connected to the line of the external voltage VDD through the second largest transistor, so that an amount of current supplied to the internal circuit 100 is smaller as compared with a case in which the semiconductor memory apparatus operates at the highest speed.

When the semiconductor memory apparatus operates at the highest speed, the internal circuit 100 is connected to the line of the external voltage VDD through the largest transistor, so that the greatest amount of current is supplied to the internal circuit 100. In this case, the current control unit 300 shown in FIG. 2B can control an amount of current supplied to the internal circuit 100 to serve as a current source unit.

The semiconductor memory apparatus according to the embodiment of the present disclosure can selectively turn on a plurality of transistors having different sizes according to operational-speed information signals to control an amount of current supplied to the internal circuit 100 according to operational speeds of the semiconductor memory apparatus.

Accordingly, the semiconductor memory apparatus according to the embodiment of the present disclosure can control an amount of current supplied to the internal circuit 100 according to the operational speeds of the semiconductor memory apparatus to reduce current consumption of the semiconductor memory apparatus.

Figure 2C:
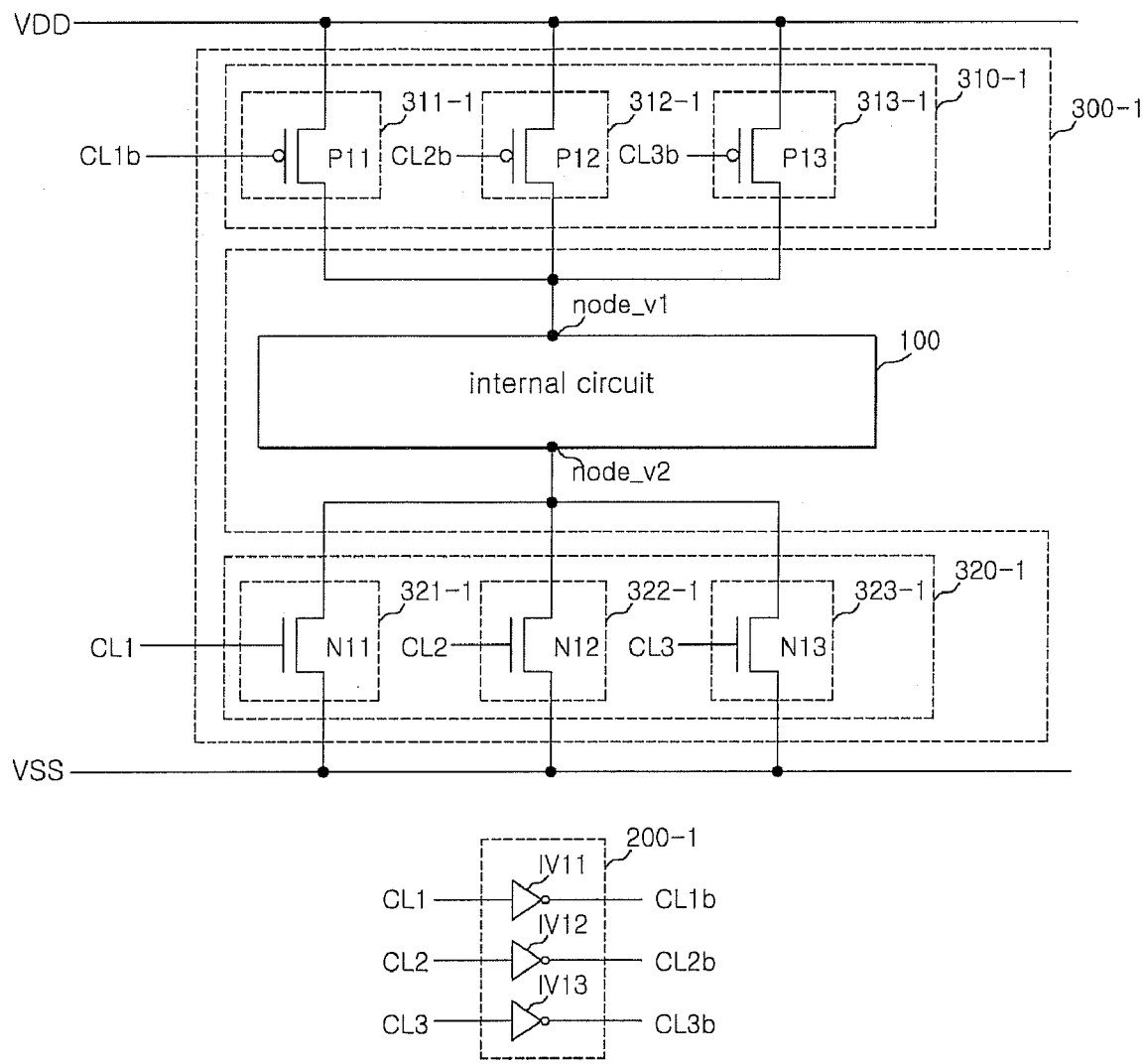
FIG. 2C is a circuit diagram showing an example of a structure of a semiconductor memory apparatus according to another embodiment of the present disclosure.

As shown in FIG. 2C, a semiconductor memory apparatus according to another embodiment of the present disclosure includes an internal circuit 100, a signal inverting unit 200-1, and a current control unit 300-1.

The internal circuit 100 operates by current flowing between first and second voltage nodes node_v1 and node_v2.

The signal inverting unit 200-1 inverts first to third operational-speed information signals 'CL1', 'CL2', and 'CL3' to generate first to third inverted operational-speed information signals 'CL1b', 'CL2b', and 'CL3b'.

The signal inverting unit 200-1 includes first to third inverters IV11, IV12, and IV13. The first inverter IV11 receives the first operational-speed information signal 'CL1' to output the first inverted operational-speed information signal 'CL1b'. The second inverter IV12 receives the second operational-speed information signal 'CL2' to output the second inverted operational-speed information signal 'CL2b'. The third inverter IV13 receives the third operational-speed information signal 'CL3' to output the third inverted operational-speed information signal 'CL3b'. In this case, if the first to third operational-speed information signals 'CL1', 'CL2', and 'CL3' are enabled at a high level, the signal inverting unit 200' enables the first to third inverted operational-speed information signals 'CL1b', 'CL2b', and 'CL3b' at a low level.

The current control unit 300-1 controls the amount of current in response to the first to third operational-speed information signals 'CL1', 'CL2', and 'CL3'. In more detail, the current control unit 300-1 controls an amount of current supplied to the internal circuit 100 in response to the first to third inverted operational-speed information signals 'CL1b', 'CL2b', and 'CL3b', and controls an amount of current flowing out of the internal circuit 100 in response to the first to third operational-speed information signals 'CL1', 'CL2', and 'CL3'.

The current control unit 300-1 includes a current source unit 310-1 and a current sink unit 320-1.

The current source unit 310-1 controls the amount of current supplied to the internal circuit 100 in response to the first to third inverted operational-speed information signals 'CL1b', 'CL2b', and 'CL3b'. In other words, the current source unit 310-1 controls an amount of current at the first voltage node node_v1 in response to the first to third inverted operational-speed information signals 'CL1b', 'CL2b', and 'CL3b'.

The current source unit 310-1 includes first to third switches 311-1 to 313-1.

If the first inverted operational-speed information signal 'CL1b' is enabled, the first switch 311-1 connects the first voltage node node_v1 with a line of the external voltage VDD.

The first switch 311-1 includes a first transistor P11. The first transistor P11 includes a gate receiving the first inverted operational-speed information signal 'CL1b', and a drain and a source connected to the first voltage node node_v1 and the line of the external voltage VDD, respectively.

If the second inverted operational-speed information signal 'CL2b' is enabled, the second switch 312-1 connects the first voltage node node_v1 with the line of the external voltage VDD.

The second switch 312-1 includes a second transistor P12. The second transistor P12 includes a gate receiving the second inverted operational-speed information signal 'CL2b', and a drain and a source connected to the first voltage node node_v1 and the line of the external voltage VDD, respectively.

If the third inverted operational-speed information signal 'CL3b' is enabled, the third switch 313-1 connects the first voltage node node_v1 with the line of the external voltage VDD.

The third switch 313-1 includes a third transistor P13. The third transistor P13 includes a gate receiving the third inverted operational-speed information signal 'CL3b', and a drain and a source connected to the first voltage node node_v1 and the line of the external voltage VDD, respectively. In this case, among the first to third transistors P11 to P13, the first transistor P11 has the smallest size, and the third transistor P13 has the largest size.

The current sink unit 320-1 controls the amount of current flowing out of the internal circuit 100 in response to the first to third operational-speed information signals 'CL1', 'CL2', and 'CL3'.

The current sink unit 320-1 includes fourth to sixth switches 321-1 to 323-1.

If the first operational-speed information signal 'CL1' is enabled, the fourth switch 321-1 connects the second voltage node node_v2 with a line of the ground voltage VSS.

The fourth switch 321-1 includes a fourth transistor N11. The fourth transistor N11 includes a gate receiving the first operational-speed information signal 'CL1', and a drain and a source connected to the second voltage node node_v2 and the line of the ground voltage VSS.

If the second operational-speed information signal 'CL2' is enabled, the fifth switch 322-1 connects the second voltage node node_V2 with the line of the ground voltage VSS.

The fifth switch 322-1 includes a fifth transistor N12. The fifth transistor N12 includes a gate receiving the second operational-speed information signal 'CL2', and a drain and a source connected to the second voltage node node_v2 and the line of the ground voltage VSS.

If the third operational-speed information signal 'CL3' is enabled, the sixth switch 323-1 connects the second voltage node node_v2 with the line of the ground voltage VSS.

The sixth switch 323-1 includes a sixth transistor N13. The sixth transistor N13 includes a gate receiving the third operational-speed information signal 'CL3', and a drain and a source connected to the second voltage node node_v2 and the line of the ground voltage VSS. In this case, among the fourth to sixth transistors N11 to N13, the fourth transistor N11 has the smallest size, and the sixth transistor N13 has the largest size.

Hereinafter, the operation of the semiconductor memory apparatus having the above structure according to another embodiment of the present disclosure will be described.

When the semiconductor memory apparatus operates at the lowest speed, among the first to third operational-speed information signals 'CL1', 'CL2', and 'CL3', only the first operational-speed information signal 'CL1' is enabled.

If only the first operational-speed information signal 'CL1' is enabled, only the first and fourth switches 311-1 and 321-1 among the first to sixth switches 311-1 to 313-1, and 321-1 to 323-1 are turned on.

The first voltage node node_v1 is connected to the line of the external voltage VDD through the first switch 311-1, and the second voltage node node_v2 is connected to the line of the ground voltage VSS through the fourth switch 321-1.

When the semiconductor memory apparatus operates at the second highest speed, among the first to third operational-speed information signals 'CL1', 'CL2', and 'CL3', only the second operational-speed information signal 'CL2' is enabled.

If only the second operational-speed information signal 'CL2' is enabled, only the second and fifth switches 312-1 and 322-1 among the first to sixth switches 311-1 to 313-1 and 321-1 to 323-1 are turned on.

The first voltage node node_v1 is connected to the line of the external voltage VDD through the second switch 312-1, and the second voltage node node_v2 is connected to the line of the ground voltage VSS through the fifth switch 322-1.

When the semiconductor memory apparatus operates at the highest speed, among the first to third operational-speed information signals 'CL1', 'CL2', and 'CL3', only the third operational-speed information signal 'CL3' is enabled.

If only the third operational-speed information signal 'CL3' is enabled, only the third and sixth switches 313-1 and 323-1 among the first to sixth switches 311-1 to 313-1, and 321-1 to 323-1 are turned on.

The first voltage node node_v1 is connected to the line of the external voltage VDD through the third switch 313-1, and the second voltage node node_v2 is connected to the line of the ground voltage VSS through the sixth switch 323-1.

When the semiconductor memory apparatus operates at the lowest speed, only the smallest transistor among transistors supplying current to the internal circuit 100 and the smallest transistor among transistors flowing out of the internal circuit 100 to the line of the ground VSS are turned on.

When the semiconductor memory apparatus operates at the second highest speed, only the second largest transistor among the transistors supplying current to the internal circuit 100 and the second largest transistor among the transistors flowing out of the internal circuit 100 to the line of the ground VSS are turned on.

When the semiconductor memory apparatus operates at the highest speed, only the largest transistor among the transistors supplying current to the internal circuit 100 and the largest transistor among the transistors flowing out of the internal circuit 100 to the line of the ground VSS are turned on.

Accordingly, an amount of current available for the internal circuit 100 is controlled according to the operational speeds of the semiconductor memory apparatus. In other words, as the operational speed of the semiconductor memory apparatus is increased, the amount of the current consumed in the internal circuit 100 is increased. In addition, as the operational speed of the semiconductor memory apparatus is decreased, the amount of the current consumed in the internal circuit 100 is reduced.

Therefore, the semiconductor memory apparatus according to another embodiment of the present disclosure controls an amount of current used in the internal circuit 100 according to the operational speeds of the semiconductor memory apparatus to reduce current consumption therein.

Figure 3A:
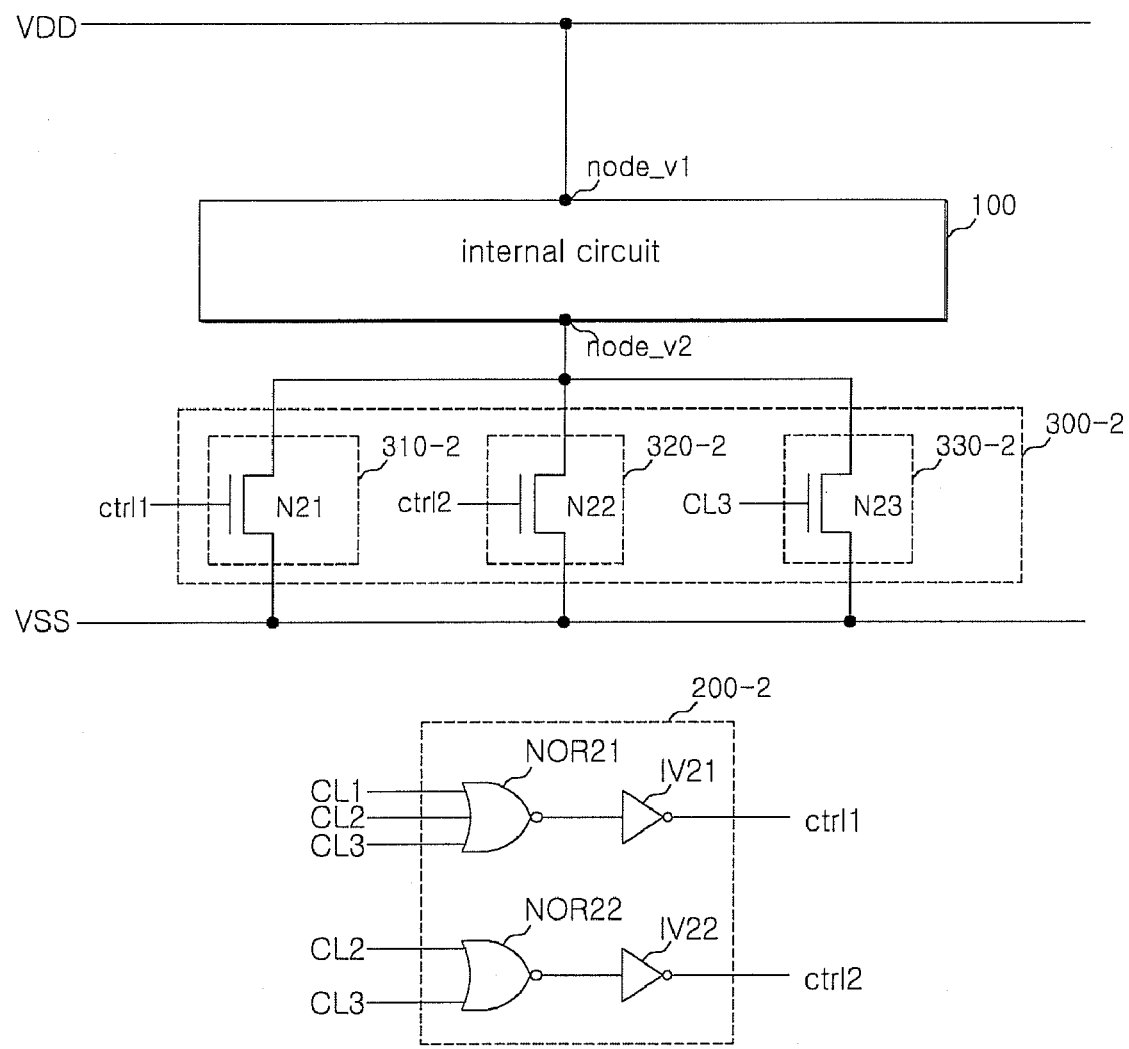
FIG. 3A is a circuit diagram showing an example of a structure of a semiconductor memory apparatus according to another embodiment of the present disclosure.

As shown in FIG. 3A, a semiconductor memory apparatus according to another embodiment of the present disclosure includes an internal circuit 100, a control signal generating unit 200-2, and a current control unit 300-2.

The internal circuit 100 is driven by current flowing between first and second voltage nodes node_v1 and node v2. In this case, the first voltage node node_v1 is connected to a line of the external voltage VDD.

The control signal generating unit 200-2 generates first and second control signals 'ctrl1' and 'ctrl2' in response to first to third operational-speed information signals 'CL1', 'CL2', and 'CL3'. In this case, if at least one of the first to third operational-speed information signals 'CL1', 'CL2', and 'CL3' is enabled, the control signal generating unit 200-2 enables the first control signal 'ctrl1'. In addition, if at least one of the second and third operational-speed information signals 'CL2' and 'CL3' is enabled, the control signal generating unit 200-2 enables the second control signal 'ctrl2'.

The control signal generating unit 200-2 includes first and second NOR gates NOR21 and NOR22, and first and second inverters IV21 and IV22. The first NOR gate NOR21 receives the first to third operational-speed information signals 'CL1', 'CL2', and 'CL3'. The first inverter IV21 receives an output signal of the first NOR gate NOR21 to output the first control signal 'ctrl1'.

The current control unit 300-2 controls an amount of the current in response to the first and second control signals 'ctrl1' and 'ctrl2' and the third operational-speed information signal 'CL3'.

The current control unit 300 includes first to third switches 310-2 to 330-2.

If the first control signal 'ctrl1' is enabled, the first switch 310-2 connects the second node node_v2 with a line of the ground voltage VSS.

The first switch 310-2 includes a first transistor N21. The first transistor N21 includes a gate receiving the first control signal 'ctrl1', and a drain and a source interposed between the second voltage node node_v2 and the line of the ground line VSS.

If the second control signal 'ctrl2' is enabled, the second switch 320-2 connects the second node node_v2 with the line of the ground voltage VSS.

The second switch 320-2 includes a second transistor N22. The second transistor N22 includes a gate receiving the second control signal 'ctrl2', and a drain and a source interposed between the second voltage node node_v2 and the line of the ground line VSS.

If the third operational-speed information signal 'CL3' is enabled, the third switch 330-2 connects the second node node_v2 with the line of the ground voltage VSS.

The third switch 330-2 includes a third transistor N23. The third transistor N23 includes a gate receiving the third operational-speed information signal 'CL3', and a drain and a source interposed between the second voltage node node_v2 and the line of the ground line VSS.

Hereinafter, the operation of the semiconductor memory apparatus having the above structure according to another embodiment of the present disclosure will be described.

When the semiconductor memory apparatus operates at the lowest speed, only the first operational-speed information signal 'CL1' among the first to third operational-speed information signals 'CL1' to 'CL3' is enabled.

If only the first operational-speed information signal 'CL1' is enabled, only the first switch 310-2 among the first to third switches 310-2 to 330-2 is turned on.

The first voltage node node_v1 is connected to the line of the external voltage VDD, and the second voltage node node_v2 is connected to the line of the ground voltage VSS through the first switch 310-2.

When the semiconductor memory apparatus operates at the second highest speed, only the second operational-speed information signal 'CL2' among the first to third operational-speed information signals 'CL1' to 'CL3' is enabled.

If only the second operational-speed information signal 'CL2' is enabled, the first and second switches 310-2 and 320-2 among the first to third switches 310-2 to 330-2 are turned on.

The first voltage node node_v1 is connected to the line of the external voltage VDD, and the second voltage node node_v2 is connected to the line of the ground voltage VSS through the first and second switches 310-2 and 320-2.

When the semiconductor memory apparatus operates at the highest speed, only the third operational-speed information signal 'CL3' among the first to third operational-speed information signals 'CL1' to 'CL3' is enabled.

If only the third operational-speed information signal 'CL3' is enabled, all of the first to third switches 310-2 to 330-2 are turned on.

The first voltage node node_v1 is connected to the line of the external voltage VDD, and the second voltage node node_v2 is connected to the line of the ground voltage VSS through the first to third switches 310-2 to 330-2.

When the semiconductor memory apparatus operates at the lowest speed, the internal circuit 100 is connected to the line of the ground voltage VSS through one transistor, so that an amount of current flowing from the internal circuit 100 to the line of the ground voltage VSS is smaller as compared with a case in which the semiconductor memory apparatus operates at the second highest speed.

When the semiconductor memory apparatus operates at the second highest speed, the internal circuit 100 is connected to the line of the ground voltage VSS through two transistors, so that the amount of the current flowing from the internal circuit 100 to the line of the ground voltage VSS is smaller as compared with a case in which the semiconductor memory apparatus operates at the highest speed.

When the semiconductor memory apparatus operates at the highest speed, the internal circuit 100 is connected to the line of the ground voltage VSS through three transistors, so that the greatest amount of current flows from the internal circuit 100 to the line of the ground voltage VSS.

The semiconductor memory apparatus according to another embodiment of the present disclosure controls the number of transistors connecting the internal circuit 100 to the line of the ground voltage VSS according to operational-speed information signals to control an amount of current used in the internal circuit 100 according to the operational speeds of the semiconductor memory apparatus. Accordingly, the amount of current used in the internal circuit 100 is controlled according to the operational speeds of the semiconductor memory apparatus according to the present disclosure, so that current consumption can be effectively reduced in the semiconductor memory apparatus.

Figure 3B:
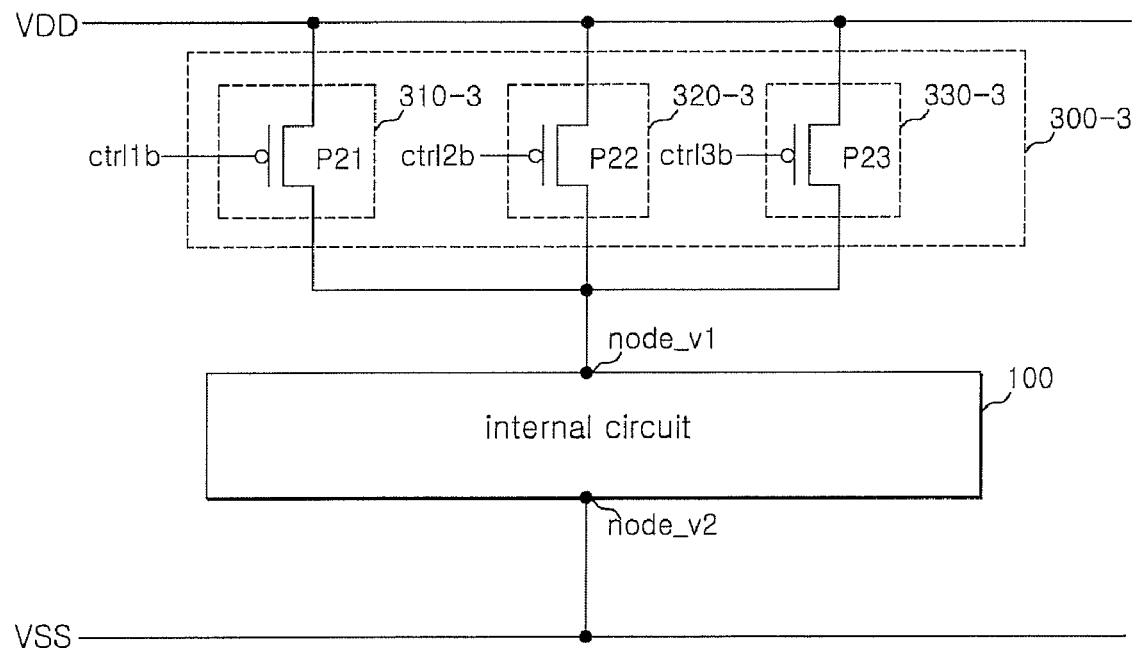
FIG. 3B is a circuit diagram showing an example of a structure of a semiconductor memory apparatus according to another embodiment of the present disclosure.
Figure 3B:
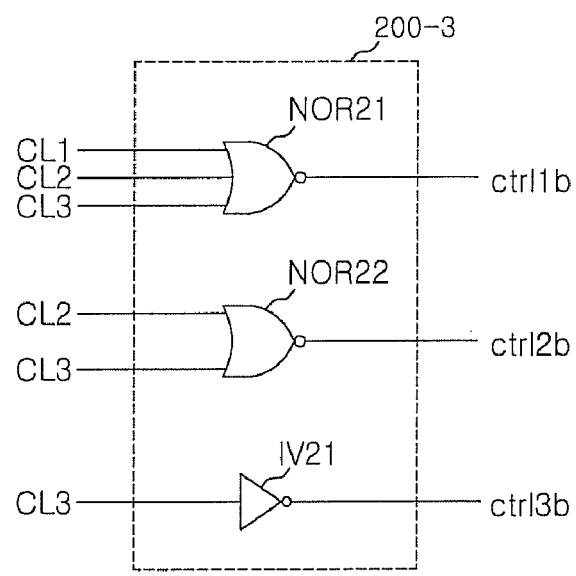

As shown in FIG. 3B, a semiconductor memory apparatus according to another embodiment of the present disclosure includes an internal circuit 100, a control signal generating unit 200-3, and a current control unit 300-3.

The internal circuit 100 is driven by current flowing between first and second voltage nodes node_v1 and node_v2. In this case, the second voltage node node_v2 is connected to a line of the ground voltage VSS.

The control signal generating unit 200-3 generates first to third inverted control signals 'ctrl1$b$', 'ctrl2$b$', and 'ctrl3$b$' in response to the first to third operational-speed information signals 'CL1', 'CL2', and 'CL3'. In this case, if at least one of the first to third operational-speed information signals 'CL1', 'CL2', and 'CL3' is enabled, the control signal generating unit 200-3 enables the first inverted control signal 'ctrl1$b$'. If at least one of the second and third operational-speed information signals 'CL2' to 'CL3' is enabled, the control signal generating unit 200-3 enables the second inverted control signal 'ctrl2$b$'. If the third operational-speed information signal 'CL3' is enabled, the control signal generating unit 200-3 enables the third inverted control signal 'ctrl3$b$'.

The control signal generating unit 200-3 includes first and second NOR gates NOR21 and NOR22, and an inverter IV21. The first NOR gate NOR21 receives the first to third operational-speed information signals 'CL1', 'CL2', and 'CL3' to generate the first inverted control signal 'ctrl1$b$'. The second NOR gate NOR22 receives the second and third operational-speed information signals CL2 and CL3 to generate the second inverted control signal 'ctrl2$b$'. The inverter IV21 receives the third operational-speed information signal CL3 to generate the third inverted control signal ctrl3$b$.

The current control unit 300-3 controls an amount of the current in response to the first to third inverted control signals 'ctrl1$b$', 'ctrl2$b$', and 'ctrl3$b$'.

The current control unit 300-3 includes first to third switches 310-3 to 330-3.

If the first inverted control signal 'ctrl1$b$' is enabled, the first switch 310-3 connects the first voltage node node_v1 with the line of the external voltage VDD.

The first switch 310-3 includes a first transistor P21. The first transistor P21 includes a gate receiving the first inverted control signal 'ctrl1$b$', and a drain and a source connected to the first voltage node node_V1 and the line of the external voltage VDD.

If the second inverted control signal 'ctrl2$b$' is enabled, the second switch 320-3 connects the first voltage node node_v1 with the line of the external voltage VDD.

The second switch 320-3 includes a second transistor P22. The second transistor P22 includes a gate receiving the second inverted control signal 'ctrl2$b$', and a drain and a source connected to the first voltage node node_V1 and the line of the external voltage VDD.

If the third inverted control signal 'ctrl3$b$' is enabled, the third switch 330-3 connects the first voltage node node_v1 with the line of the external voltage VDD.

The third switch 330-3 includes a third transistor P23. The third transistor P23 includes a gate receiving the third inverted control signal 'ctrl3$b$', and a drain and a source connected to the first voltage node node_v1 and the line of the external voltage VDD.

Hereinafter, the operation of the semiconductor memory apparatus having the above structure according to another embodiment of the present disclosure will be described.

When the semiconductor memory apparatus operates at the lowest speed, only the first operational-speed information signal 'CL1' among the first to third operational-speed information signals 'CL1' to 'CL3' is enabled.

If only the first operational-speed information signal 'CL1' is enabled, only the first switch 310-3 among the first to third switches 310-3 to 330-3 is turned on.

The first voltage node node_v1 is connected with the line of the external voltage VDD through the first switch 310-3, and the second voltage node node_v2 is connected to the line of the ground voltage VSS.

When the semiconductor memory apparatus operates at the second highest speed, only the second operational-speed information signal 'CL2' among the first to third operational-speed information signals 'CL1' to 'CL3' is enabled.

If only the second operational-speed information signal 'CL2' is enabled, the first and second switches 310-3 and 320-3 among the first to third switches 310-3 to 330-3 are turned on.

The first voltage node node_v1 is connected with the line of the external voltage VDD through the first and second switches 310-3 and 320-3, and the second voltage node node_v2 is connected to the line of the ground voltage VSS.

When the semiconductor memory apparatus operates at the highest speed, only the third operational-speed information signal 'CL3' among the first to third operational-speed information signals 'CL1' to 'CL3' is enabled.

If only the third operational-speed information signal 'CL3' is enabled, all of the first to third switches 310-3 to 330-3 are turned on.

The first voltage node node_v1 is connected with the line of the external voltage VDD through the first to third switches 310-3 to 330-3, and the second voltage node node_v2 is connected to the line of the ground voltage VSS.

When the semiconductor memory apparatus operates at the lowest speed, current is supplied to the internal circuit 100 through one transistor.

When the semiconductor memory apparatus operates at the second highest speed, the current is supplied to the internal circuit 100 through two transistors.

When the semiconductor memory apparatus operates at the highest speed, the current is supplied to the internal circuit 100 through three transistors.

The semiconductor memory apparatus according to another embodiment of the present disclosure controls the number of turned-on transistors according to the operational speeds of the semiconductor memory apparatus, and the turned-on transistors supplies current to the internal circuit 100. For example, as the operational speed of the semiconductor memory apparatus is increased, the number of the turned-on transistors is increased, and current is supplied to the internal circuit 100 through the turned-on transistors. In other words, as the operational speed of the semiconductor memory apparatus according to the disclosure is increased, a greater amount of current is supplied to the internal circuit 100.

The semiconductor memory apparatus according to another embodiment of the present disclosure controls an amount of current supplied to the internal circuit 100 according to the operational speeds of the semiconductor memory apparatus, so that current consumption can be reduced in the semiconductor memory apparatus.

Figure 3C:
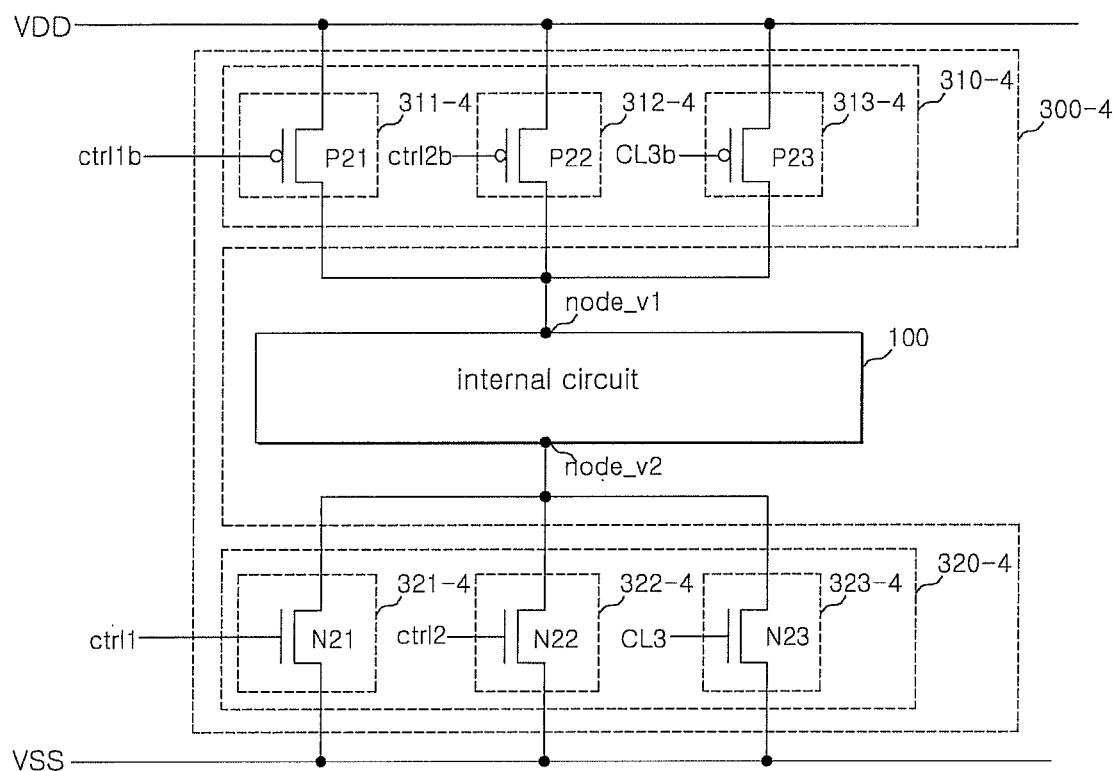
FIG. 3C is a circuit diagram showing an example of a structure of a semiconductor memory apparatus according to another embodiment of the present disclosure.
Figure 3C:
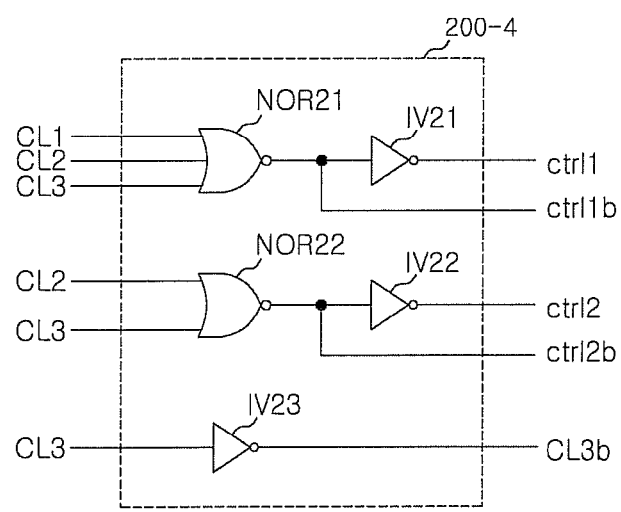

As shown in FIG. 3C, a semiconductor memory apparatus according to another embodiment of the present disclosure includes an internal circuit 100, a control signal generating unit 200-4, and a current control unit 300-4.

The internal circuit 100 is driven by current flowing between first and second voltage nodes node_v1 and node_v2.

The control signal generating unit 200-4 generates first and second control signals 'ctrl1' and 'ctrl2', first and second inverted control signals 'ctrl1b' and 'ctrl2b', and a third inverted operational-speed information signal 'CL3b' in response to first to third operational-speed information signals 'CL1' to 'CL3'. For example, if at least one of the first to third operational-speed information signals 'CL1' to 'CL3' is enabled, the control signal generating unit 200-4 enables the first control signal ctrl1 and the first inverted control signal 'ctrl1b'. If at least one of the second and third operational-speed information signals 'CL2' and 'CL3' is enabled, the control signal generating unit 200-4 enables the second control signal 'ctrl2' and the second inverted control signal 'ctrl2b'. If the third operational-speed information signal 'CL3' is enabled, the control signal generating unit 200-4 enables the third inverted operational-speed information signal 'CL3b'.

The control signal generating unit 200-4 includes first and second NOR gates NOR21 and NOR22, and first to third inverters IV21 to IV23. The NOR gate NOR21 receives the first to third operational-speed information signals 'CL1' to 'CL3' to generate the first inverted control signal 'ctrl1b'. The first inverter IV21 receives the first inverted control signal 'ctrl1b' to generate the first control signal 'ctrl1'. The second NOR gate NOR22 receives the second and third operational-speed information signals 'CL2' and 'CL3' to generate the second inverted control signal 'ctrl2b'. The second inverter IV22 receives the second inverted control signal 'ctrl2b' to generate the second control signal 'ctrl2'. The third inverter IV23 receives the third operational-speed information signal 'CL3' to generate the third inverted operational-speed information signal 'CL3b'.

The current control unit 300-4 controls an amount of the current in response to the first and second control signals 'ctrl1' and 'ctrl2', the first and second inverted control signals 'ctrl1b' and 'ctrl2b', the third inverted operational-speed information signal 'CL3b', and the third operational-speed information signal 'CL3'.

The current control unit 300-4 includes a current source unit 310-4 and the current sink unit 320-4.

The current source unit 310-4 controls the amount of the current supplied to the internal circuit 100 by receiving the first inverted control signal 'ctrl1b', the second inverted control signal 'ctrl2b', and the third inverted operational-speed information signal 'CL3b'.

The current source unit 310-4 includes first to third switches 311-4 to 313-4.

If the first inverted control signal 'ctrl1b' is enabled, the first switch 311-4 connects the first voltage node node_v1 with a line of the external voltage VDD.

The first switch 311-4 includes a first transistor P21. The first transistor P21 includes a gate receiving the first inverted control signal 'ctrl1b', and a drain and a source connected to the first voltage node node_v1 and the line of the external voltage VDD, respectively.

If the second inverted control signal 'ctrl2b' is enabled, the second switch 312-4 connects the first voltage node node_v1 with the line of the external voltage VDD.

The second switch 312-4 includes a second transistor P22. The second transistor P22 includes a gate receiving the second inverted control signal 'ctrl2b', and a drain and a source connected to the first voltage node node_v1 and the line of the external voltage VDD, respectively.

If the third inverted control signal 'CL3b' is enabled, the third switch 313-4 connects the first voltage node node_v1 with the line of the external voltage VDD.

The third switch 313-4 includes a third transistor P23. The third transistor P23 includes a gate receiving the third inverted operational-speed information signal 'CL3b', and a drain and a source connected to the first voltage node node_v1 and the line of the external voltage VDD, respectively.

The current sink unit 320-4 controls an amount of current flowing from the internal circuit 100 to the line of the ground voltage VSS in response to the first and second control signals 'ctrl1' and 'ctrl2', and the third operational-speed information signal 'CL3'.

The current sink unit 320-4 includes fourth to sixth switches 321-4 to 323-4.

If the first control signal 'ctrl1' is enabled, the fourth switch 321-4 connects the second voltage node node_v2 with the line of the ground voltage VSS.

The fourth switch 321-4 includes a fourth transistor N21. The fourth transistor N21 includes a gate receiving the first control signal 'ctrl1', and a drain and a source connected to the second voltage node node_v2 and the line of the ground voltage VSS.

If the second control signal 'ctrl2' is enabled, the fifth switch 322-4 connects the second voltage node node_v2 with the line of the ground voltage VSS.

The fifth switch 322-4 includes a fifth transistor N22. The fifth transistor N22 includes a gate receiving the second control signal 'ctrl2', and a drain and a source connected to the second voltage node node_v2 and the line of the ground voltage VSS.

If the third operational-speed information signal 'CL3' is enabled, the sixth switch 323-4 connects the second voltage node node_v2 with the line of the ground voltage VSS.

The sixth switch 323-4 includes a sixth transistor N23. The sixth transistor N23 includes a gate receiving the third operational-speed information signal 'CL3', and a drain and a source connected to the second voltage node node_v2 and the line of the ground voltage VSS.

Hereinafter, the operation of the semiconductor memory apparatus having the above structure according to another embodiment of the present disclosure will be described.

When the semiconductor memory apparatus operates at the lowest speed, only the first operational-speed information signal 'CL1' among the first to third operational-speed information signals 'CL1' to 'CL3' is enabled.

If the first operational-speed information signal 'CL1' is enabled, the first switch 311-4 among the first to third switches 311-4 to 313-4 is turned on, and the fourth switch 321-4 among the fourth to sixth transistors 321-4 to 323-4 is turned on.

The first voltage node node_v1 is connected to the line of the external voltage VDD through the first switch 311-4, and the second voltage node node_v2 is connected to the line of the ground voltage VSS through the fourth switch 321-4.

When the semiconductor memory apparatus operates at the second highest speed, only the second operational-speed information signal 'CL2' among the first to third operational-speed information signals 'CL1' to 'CL3' is enabled.

If the second operational-speed information signal 'CL2' is enabled, the first and second switches 311-4 and 312-4 among the first to third switches 311-4 to 313-4 are turned on, and the fourth and fifth switches 321-4 and 322-4 among the fourth to sixth transistors 321-4 to 323-4 are turned on.

The first voltage node node_v1 is connected to the line of the external voltage VDD through the first and second switches 311-4 and 312-4, and the second voltage node node_v2 is connected to the line of the ground voltage VSS through the fourth and fifth switches 321-4 and 322-4.

When the semiconductor memory apparatus operates at the highest speed, only the third operational-speed information signal 'CL3' among the first to third operational-speed information signals 'CL1' to 'CL3' is enabled.

If the third operational-speed information signal 'CL3' is enabled, all of the first to sixth switches 311-4 to 313-4 and 321-4 to 323-4 are turned on.

The first voltage node node_v1 is connected to the line of the external voltage VDD through the first to third switches 311-4 to 313-4, and the second voltage node node_v2 is connected to the line of the ground voltage VSS through the fourth to sixth switches 321-4 to 323-4.

When the semiconductor memory apparatus operates at the lowest speed, current is supplied to the internal circuit 100 through one switch, and flows out of the internal circuit 100 through one switch.

When the semiconductor memory apparatus operates at the second highest speed, current is supplied to the internal circuit 100 through two switches, and flows out of the internal circuit 100 through two switches.

When the semiconductor memory apparatus operates at the highest speed, current is supplied to the internal circuit 100 through three switches, and flows out of the internal circuit 100 through three switches.

The semiconductor memory apparatus according to another embodiment of the present disclosure controls the number of switches supplying current to the internal circuit 100, and controls the number of switches allowing current to flow from the internal circuit 100 to the line of the ground voltage according to the operational speeds of the semiconductor memory apparatus. Therefore, according to the disclosure, an amount of current used in the internal circuit 100 can be controlled according to the operational speeds of the semiconductor memory apparatus.

In addition, according to the present disclosure, an amount of current used in the internal circuit 100 can be controlled according to the operational speeds of the semiconductor memory apparatus, so that current consumption of the semiconductor memory apparatus can be reduced.

Figure 4A:
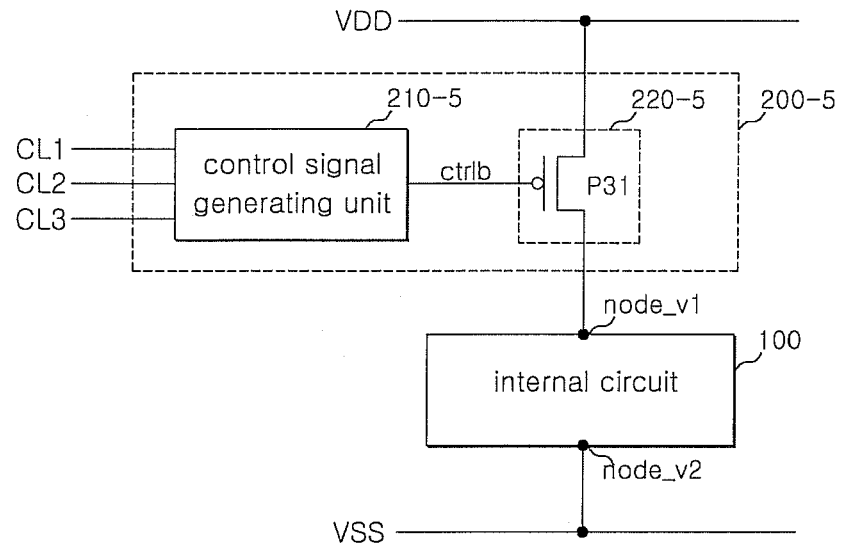
FIG. 4A is a circuit diagram showing an example of a structure of a semiconductor memory apparatus according to another embodiment of the present disclosure.

As shown in FIG. 4A, a semiconductor memory apparatus according to another embodiment of the present disclosure includes an internal circuit 100 and a current control unit 200-5.

The internal circuit 100 is driven by current flowing between first and second voltage nodes node_v1 and node_v2. The second voltage node node_v2 is connected to a line of the ground voltage VSS.

The current control unit 200-5 controls an amount of the current in response to first to third operational-speed information signals 'CL1', 'CL2', and 'CL3'. For example, as the operational speed of the semiconductor memory apparatus is increased, the current control unit 200-5 increases an amount of the current in response to the first to third operational-speed information signals 'CL1', 'CL2', and 'CL3'. In other words, as the operational speed of the semiconductor memory apparatus is increased, the current control unit 200-5 increases an amount of the current supplied to the internal circuit 100 in response to the first to third operational-speed information signals 'CL1', 'CL2', and 'CL3'.

The current control unit 200-5 includes a control signal generating unit 210-5 and a switch 220-5.

The control signal generating unit 210-5 controls a voltage level of an inverted control signal 'ctrlb' in response to the first to third operational-speed information signals 'CL1', 'CL2', and 'CL3'. For example, as the operational speed of the semiconductor memory apparatus is increased, the control signal generating unit 210-5 lowers the voltage level of the inverted control signal 'ctrlb' in response to the first to third operational-speed information signals 'CL1', 'CL2', and 'CL3'.

Figure 5:
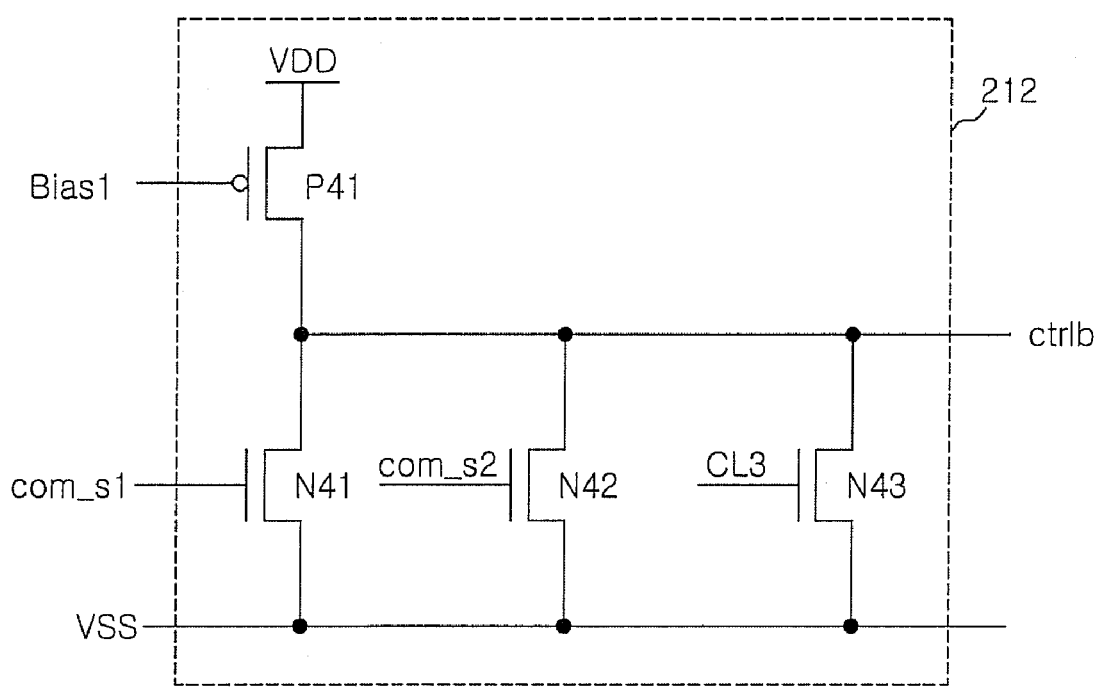
FIG. 5 is a view showing a control signal generating unit of FIG. 4A in detail.
Figure 5:
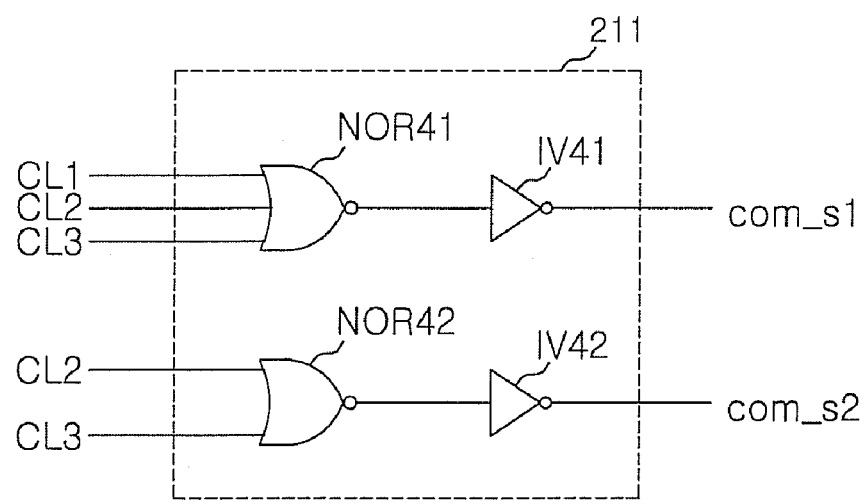

As shown in FIG. 5, the control signal generating unit 210-5 includes a combined signal generating unit 211 and a signal voltage control unit 212.

The combined signal generating unit 211 generates first and second combined signals 'com_s1' and 'com_s2' in response to the first to third operational-speed information signals 'CL1', 'CL2', and 'CL3'. For example, if at least one of the first to third operational-speed information signals 'CL1', 'CL2', and 'CL3' is enabled, the combined signal generating unit 211 enables the first combined signal com_s1. In addition, if at least one of the second and third operational-speed information signals 'CL2' and 'CL3' is enabled, the combined signal generating unit 211 enables the second combined signal 'com_s2'.

The combined signal generating unit 211 includes first and second NOR gates NOR41 and NOR42 and first and second inverters IV41 and IV42. The first NOR gate NOR41 receives the first to third operational-speed information signals 'CL1' to 'CL3'. The first inverter IV41 receives an output signal of the first NOR gate NOR41 to generate the first combined signal com_s1. The second NOR gate NOR42 receives the second and third operational-speed information signals 'CL2' and 'CL3'. The second inverter IV42 receives an output signal of the second NOR gate NOR42 to generate the second combined signal 'com_s2'.

The signal voltage control unit 212 lowers the voltage level of the inverted control signal 'ctrlb' when the first and second combined signals 'com_s1' and 'com_s2' are enabled as compared with when only the first combined signal 'com_s1' is enabled. In addition, the signal voltage control unit 212 lowers the voltage level of the inverted control signal 'ctrlb' when all of the first and second combined signals 'com_s1' and 'com_s2' and the third operational-speed information signal 'CL3' are enabled as compared with when the first and second combined signals 'com_s1' and 'com_s2' are enabled.

The signal voltage control unit 212 includes first to fourth transistors P41 and N41 to N43. The first transistor P41 includes a gate receiving bias voltage 'Bias1' and a source connected to a line of the external voltage 'VDD'. The second transistor N41 includes a gate receiving the first combined signal 'com_s1', a drain connected to a drain of the first transistor P41, and a source connected to a line of the ground voltage VSS. The third transistor N42 includes a gate receiving the second combined signal 'com_s2', a drain connected to a node connecting the first transistor P41 with the second transistor N41, and a source connected to the line of the ground voltage VSS. The fourth transistor N43 includes a gate receiving the third operational-speed information signal 'CL3', a drain connected to the node connecting the first to third transistors P41, N41, and N42 with each other, and a source connected to the line of the ground voltage VSS. In this case, the inverted control signal 'ctrlb' is output from the node connecting the first to third transistors P41 and N41 to N43 with each other.

In FIG. 4A, as the voltage level of the control signal 'ctrlb' is lowered, the switch 220-5 increases an amount of the current delivered to the first voltage node node_v1.

The switch 220-5 includes a PMOS transistor P31. The PMOS transistor P31 includes a gate receiving the control signal 'ctrlb' and a drain and a source connected to the line of the external voltage VDD and the first voltage node node_v1. In general, as the voltage level of the gate is lowered, a turn-on degree of the PMOS transistor P31 is increased. Accordingly, as the voltage level of the control signal 'ctrlb' becomes lowered, the turn-on degree of the PMOS transistor P31 is increased, so that an amount of current flowing from the line of the external voltage VDD to the first voltage node node_v1 is increased.

Hereinafter, the operation of the semiconductor memory apparatus having the above structure according to another embodiment of the present disclosure will be described.

When the semiconductor memory apparatus operates at the lowest speed, only the first operational-speed information signal 'CL1' among the first to third operational-speed information signals 'CL1' to 'CL3' is enabled.

If the first operational-speed information signal 'CL1' is enabled, only the first combined signal 'com_s1' is enabled.

If the first combined signal 'com_s1' is enabled, the second transistor N41 constituting the signal voltage control unit 212 shown in FIG. 5 is turned on. If the second transistor N41 is turned on, the voltage level of the inverted control signal 'ctrlb' is lower as compared with a case in which the second transistor N41 is not turned on.

The switch 220-5 shown in FIG. 4A receives the inverted control signal 'ctrlb', the voltage level of which is lowered, and is turned on to supply current to the first voltage node 'node_v1'.

When the operational speed of the semiconductor memory apparatus operates at the second highest speed, the second operational-speed information signal 'CL2' among the first to third operational-speed information signals 'CL1' to 'CL3' is enabled.

If the second operational-speed information signal 'CL2' is enabled, the first and second combined signals 'com_s1' and 'com_s2' are enabled.

The second and third transistors N41 and N42 constituting the signal voltage control unit 212 are turned on.

The signal voltage control unit 212 lowers the voltage level of the inverted control signal 'ctrlb' when the second and third transistors N41 and N42 are turned on as compared with when the second transistor N41 is turned on.

The switch 220-5 receives the inverted control signal 'ctrlb' and is turned on to supply current to the first voltage node node_v1. In this case, a greater amount of current flows to the first voltage node node_v1 as compared with that of current flowing to the first voltage node node_v1 when the semiconductor memory apparatus operates at the lowest speed.

When the semiconductor memory apparatus operates at the highest speed, the third operational-speed information signal 'CL3' among the first to third operational-speed information signals 'CL1' to 'CL3' is enabled.

If the third operational-speed information signal 'CL3' is enabled, the first and second combined signals 'com_s1' and 'com_s2' are enabled.

The second to fourth transistors N41 to N43 constituting the signal voltage control unit 212 are turned on. The voltage level of the inverted control signal 'ctrl_b' is lower when the second to fourth transistors N41 to N43 are turned on as compared with when the second and third transistors N41 and N42 are turned.

The switch 220-5 receives the inverted control signal 'ctrlb' and is turned on to supply current to the first voltage node node_v1. In this case, a greater amount of current flows to the first voltage node node_v1 as compared with that current flowing to the first voltage node node_v1 when the semiconductor memory apparatus operates at the second highest speed.

The semiconductor memory apparatus according to another embodiment of the present disclosure can control an amount of current supplied to the internal circuit 100 according to the operational speeds of the semiconductor memory apparatus to reduce current consumption of the semiconductor memory apparatus.

Figure 4B:
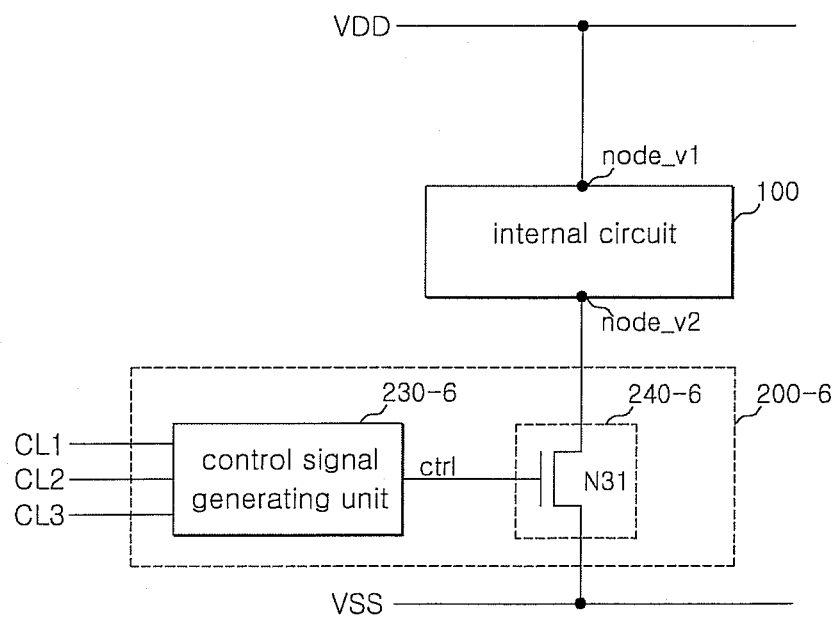
FIG. 4B is a circuit diagram showing an example of a structure of a semiconductor memory apparatus according to another embodiment of the present disclosure.

As shown in FIG. 4B, the semiconductor memory apparatus according to another embodiment of the present disclosure includes an internal circuit 100 and a current control unit 200-6.

The internal circuit 100 is driven by current flowing between first and second voltage nodes node_v1 and node_v2. In this case, the first voltage node node_v1 is connected to a line of the external voltage VDD.

The current control unit 200-6 controls an amount of current flowing from the internal circuit 100 to a line of the ground voltage VSS in response to first to third operational-speed information signals 'CL1' to 'CL3'. For example, as the operational speed of the semiconductor memory apparatus is increased, the current control unit 200-6 increases the amount of the current in response to the first to third operational-speed information signals 'CL1' to 'CL3'. In other words, as the operational speed of the semiconductor memory apparatus is increased, the current control unit 200-6 increases an amount of current flowing to the second voltage node 'node_v2'.

The current control unit 200-6 includes a control signal generating unit 230-6 and a switch 240-6.

The control signal generating unit 230-6 controls a voltage level of a control signal 'ctrl' in response to the first to third operational-speed information signals 'CL1' to 'CL3'. For example, as the operational speed of the semiconductor memory apparatus is increased, the control signal generating unit 230-6 increases the voltage level of the control signal 'ctrl' in response to the first to third operational-speed information signals 'CL1' to 'CL3'.

Figure 6:
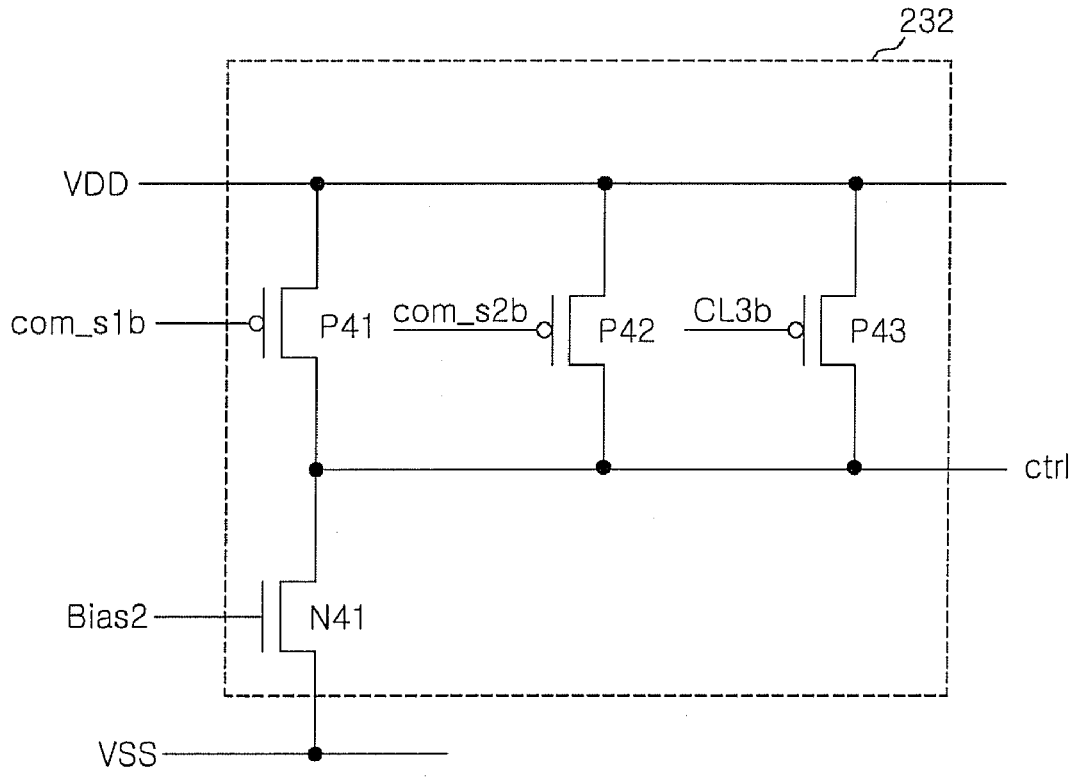
FIG. 6 is a view showing a control signal generating unit of FIG. 4B in detail.
Figure 6:
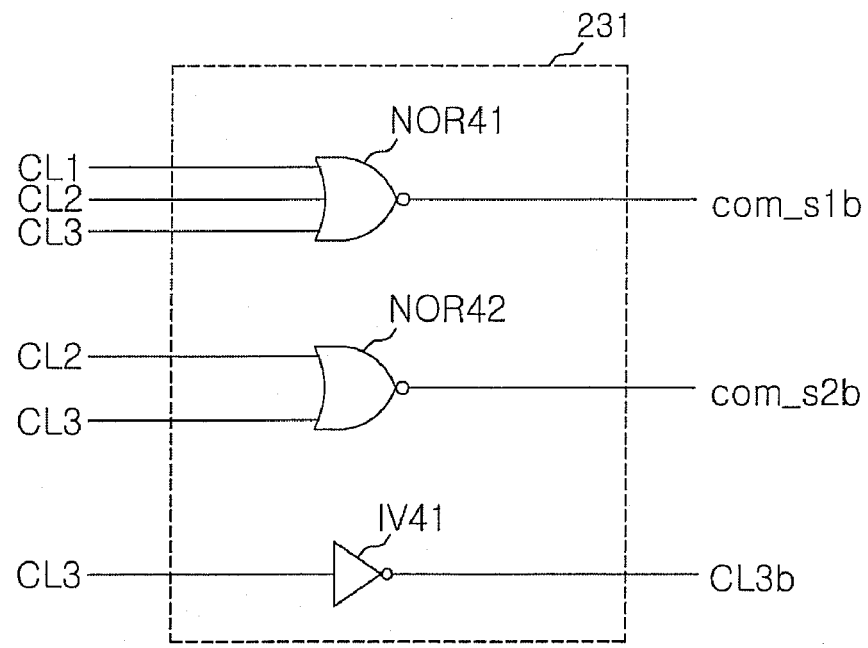

As shown in FIG. 6, the control signal generating unit 230-6 includes a combined signal generating unit 231 and a signal voltage control unit 232.

The combined signal generating unit 231 generates a first inverted combined signal 'com_s1b', a second inverted combined signal 'com_s2b', and a third inverted operational-speed information signal 'CL3b' in response to the first to third operational-speed information signals 'CL1' to 'CL3'. For example, if at least one of the first to third operational-speed information signals 'CL1' to 'CL3' is enabled, the combined signal generating unit 231 enables the first inverted combined signal 'com_s1b'. If at least one of the second and third operational-speed information signals 'CL2' and 'CL3' is enabled, the combined signal generating unit 231 enables the second inverted combined signal 'com_s2b'. If the third operational-speed information signal 'CL3' is enabled, the combined signal generating unit 231 enables the third inverted operational-speed information signal 'CL3b'.

The combined signal generating unit 231 includes first and second NOR gates NOR41 and NOR42, and an inverter IV41. The NOR gate NOR41 receives the first to third operational-speed information signals 'CL1' to 'CL3' to generate the first inverted combined signal 'com_s1b'. The second NOR gate NOR42 receives the second and third operational-speed information signals 'CL2' and 'CL3' to generate the second inverted combined signal 'com_s2b'. The inverter IV41 receives the third operational-speed information signal 'CL3' to generate the third inverted operational-speed information signal 'CL3b'.

The signal voltage control unit 232 raises a voltage level of the control signal 'ctrl' when the first and second inverted combined signals 'com_s1b' and 'com_s2b' are enabled as compared with when only the first inverted combined signal 'com_s1b' is enabled. In addition, the signal voltage control unit 322 raises the voltage level of the control signal 'ctrl' when the first and second inverted combined signals 'com_s1b' and 'com_s2b', and the third inverted operational-speed information signal 'CL3b' are enabled as compared with when the first and second inverted combined signals 'com_s1b' and 'com_s2b' are enabled.

The signal voltage control unit 232 includes first to fourth transistors N41 and P41 to P43. The first transistor N41 includes a gate receiving second bias voltage Bias 2 and a source connected to the line of the ground voltage VSS. The second transistor P41 includes a gate receiving the first inverted combined signal 'com_s1b', a source connected to a line of the external voltage VDD, and a drain connected to a drain of the first transistor N41. The third transistor P42 includes a gate receiving the second inverted combined signal 'com_s2b', a source connected to the line of the external voltage VDD, and a drain connected to a node connecting the first transistor N41 with the second transistor P41. The fourth transistor P43 includes a gate receiving the third inverted operational-speed information signal 'CL3b', a source connected to the line of the external voltage VDD, and a drain connected to the node connecting the first to third transistors N41, P41, and P42 with each other. In this case, the control signal 'ctrl' is generated from the node connecting the first to fourth third transistors N41 and P41 to P43 with each other.

As shown in FIG. 4B, the switch 240-6 includes an NMOS transistor N31. The NMOS transistor N31 includes a gate receiving the control signal 'ctrl', a drain connected to the second voltage node node_v2, and a source connected to the line of the ground voltage VSS. In general, as a voltage level applied to the gate is increased, a turn-on degree of the NMOS transistor N31 is increased. In other words, as the voltage level of the control signal 'ctrl' is increased, the turn-on degree of the NMOS transistor N31 is increased, so that an amount of current flowing from the second voltage node node_v2 to the line of the ground voltage VSS is increased.

Hereinafter, the operation of the semiconductor memory apparatus having the above structure according to another embodiment of the present disclosure will be described.

When the semiconductor memory apparatus operates at the lowest speed, only the first operational-speed information signal 'CL1' among the first to third operational-speed information signals 'CL1' to 'CL3' is enabled.

If the first operational-speed information signal 'CL1' is enabled, the first inverted combined signal 'com_s1b' is enabled. If the first inverted combined signal 'com_s1b' is enabled, the second transistor P41 constituting the signal voltage control unit 232 shown in FIG. 6 is turned on. If the second transistor P41 is turned on, the control signal 'ctrl' has a higher level as compared with a case in which the second transistor P41 is not turned on.

The switch 240-6 receiving the control signal 'ctrl' is turned on so that current flows from the second voltage node node_v2 to the line of the ground voltage VSS.

When the semiconductor memory apparatus operates at the second highest speed, the second operational-speed information signal 'CL2' among the first to third operational-speed information signals 'CL1' to 'CL3' is enabled.

If the second operational-speed information signal 'CL2' is enabled, the first and second inverted combined signals 'com_s1b' and 'com_s2b' are enabled. If the first and second inverted combined signals 'com_s1b' and 'com_s2b' are enabled, the second and third transistors P41 and P42 constituting the signal voltage control unit 232 are turned on. If the second and third transistors P41 and P42 are turned on, the control signal 'ctrl' having a higher level is generated as compared with a case in which only the second transistor P41 is turned on.

The switch 240-6 receives the control signal 'ctrl' and is turned on to allow current to flow from the second voltage node node_v2 to the line of the ground voltage VSS. In this case, since the voltage level of the control signal 'ctrl' is increased as compared with a case in which the semiconductor memory apparatus operates at the lowest speed, a turn-on degree of the switch 240-6 is increased. Accordingly, the switch 240-6 allows a greater amount of current to flow to the line of the ground voltage VSS as compared with a case in which the semiconductor memory apparatus operates at the lowest speed.

When the semiconductor memory apparatus operates at the highest speed, the third operational-speed information signal 'CL3' among the first to third operational-speed information signals 'CL1' to 'CL3' is enabled.

If the third operational-speed information signal 'CL3' is enabled, the first and second inverted combined signals 'com_s1b' and 'com_s2b' and the third inverted operational-speed information signal 'CL3b' are enabled. If the first and second inverted combined signals 'com_s1b' and 'com_s2b' and the third inverted operational-speed information signal 'CL3b' are enabled, the second to fourth transistors P41 to P43 constituting the signal voltage control unit 232 are turned on. If the second to fourth transistors P41 to P43 are turned on, the control signal 'ctrl' having a higher level is generated as compared with a case in which the semiconductor memory apparatus operates at the second highest speed.

The control signal 'ctrl' is applied to the switch 240-6, and the switch 240-6 is turned on so that current flows from the second voltage node node_v2 to the line of the ground voltage VSS. In this case, since the switch 240-6 receives the control signal 'ctrl' having the highest voltage level, the switch is turned on with the greatest turn-on degree. Accordingly, the maximum amount of current flows through the switch 240-6.

The semiconductor memory apparatus according to another embodiment of the present disclosure controls an amount of current flowing from the internal circuit 100 to the line of the ground voltage VSS according to the operational speeds of the semiconductor memory apparatus. Therefore, according to the present disclosure, current consumption can be effectively reduced in the semiconductor memory apparatus.

Figure 4C:
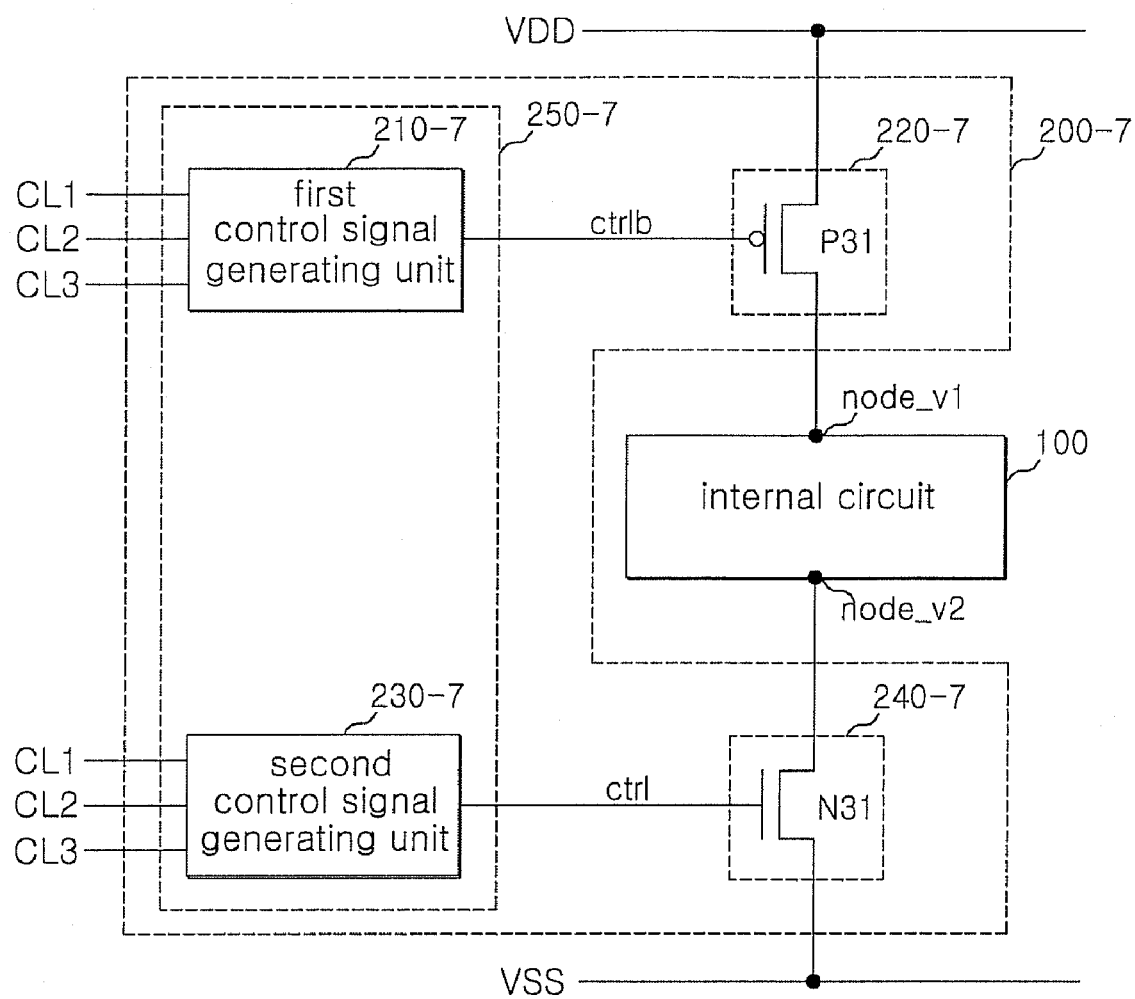
FIG. 4C is a circuit diagram showing an example of a structure of a semiconductor memory apparatus according to another embodiment of the present disclosure.

As shown in FIG. 4C, the semiconductor memory apparatus according to another embodiment of the present disclosure includes an internal circuit 100 and a current control unit 200-7.

The internal circuit 100 is driven by current flowing between first and second voltage nodes node_v1 and node_v2.

The current control unit 200-7 controls an amount of current in response to first to third operational-speed information signals 'CL1' to 'CL3'. For example, as the operational speed of the semiconductor memory apparatus is increased, the current control unit 200-7 increases an amount of current supplied to the first voltage node node_v1 in response to the first to third operational-speed information signals 'CL1' to 'CL3'. In addition, as the operational speed of the semiconductor memory apparatus is increased, the current control unit 200 increases an amount of current flowing from the second voltage node node_v2 to a line of the ground voltage VSS in response to the first to third operational-speed information signals 'CL1' to 'CL3'.

The current control unit 200-7 includes a control signal generating unit 250-7 and first and second switches 220-7 and 240-7.

The control signal generating unit 250-7 generates a control signal 'ctrl' and an inverted control signal 'ctrlb' in response to the first to third operational-speed information signals 'CL1' to 'CL3'. For example, as the operational speed of the semiconductor memory apparatus is increased, the control signal generating unit 250-7 raises a voltage level of the control signal 'ctrl' and lowers a voltage level of the inverted control signal 'ctrlb' in response to the first to third operational-speed information signals 'CL1' to 'CL3'.

The control signal generating unit 250-7 includes a first control signal generating unit 210-7 and a second control signal generating unit 230-7.

As the operational speed of the semiconductor memory apparatus is increased, the first control signal generating unit 210-7 lowers the voltage level of the inverted control signal 'ctrlb' in response to the first to third operational-speed information signals 'CL1' to 'CL3'. As described above, the first control signal generating unit 210-7 may have the same structure as that of the control signal generating unit 210-5 shown in FIG. 5. Accordingly, the details of the first control signal generating unit 210-7 will be omitted in order to avoid redundancy.

As the operational speed of the semiconductor memory apparatus is increased, the second control signal generating unit 230-7 raises the voltage level of the control signal 'ctrl' in response to the first to third operational-speed information signals 'CL1' to 'CL3'. As described above, the second control signal generating unit 230-7 may have the same structure as that of the control signal generating unit 230-6 shown in FIG. 6. Accordingly, the details of the second control signal generating unit 230-7 will be omitted in order to avoid redundancy.

As the voltage level of the inverted control signal 'ctrlb' is lowered, the first switch 220-7 increases an amount of the current delivered to the first voltage node 'node_v1'.

The first switch 220-7 includes a PMOS transistor P31. The PMOS transistor P31 includes a gate receiving the inverted control signal 'ctrlb', and a drain and a source connected to a line of the external voltage VDD and the first voltage node node_v1. In general, as a voltage level of the gate is lowered, a turn-on degree of the PMOS transistor P31 is increased. Accordingly, as a voltage level of the inverted control signal 'ctrlb' is lowered, the turn-on degree of the PMOS transistor P31 is increased, so that the PMOS transistor P31 increases an amount of current flowing from the line of the external voltage VDD to the first voltage node node_v1.

As the voltage level of the control signal 'ctrl' is raised, the second switch 240-7 increases an amount of current flowing from the second voltage node node_V2 to the line of the ground voltage vss.

The second switch 240-7 includes an NMOS transistor N31. The NMOS transistor N31 includes a gate receiving the control signal 'ctrl', and a drain and a source connected to the second voltage node node_v2 and the line of the ground voltage VSS, respectively. In general, as a voltage level of the gate is increased, a turn-on degree of the NMOS transistor N31 is increased. In other words, as a voltage level of the control signal 'ctrl' is increased, the turn-on degree of the NMOS transistor N31 is increased, so that the NMOS transistor N31 increases an amount of current flowing from the second voltage node node_v2 to the line of the ground voltage VSS.

Hereinafter, the operation of the semiconductor memory apparatus having the above structure according to another embodiment of the present disclosure will be described.

When the semiconductor memory apparatus operates at the lowest speed, the first operational-speed information signal 'CL1' among the first to third operational-speed information signals 'CL1' to 'CL3' is enabled.

When the semiconductor memory apparatus operates at the second highest speed, the second operational-speed information signal 'CL2' among the first to third operational-speed information signals 'CL1' to 'CL3' is enabled.

When the semiconductor memory apparatus operates at the highest speed, the third operational-speed information signal 'CL3' among the first to third operational-speed information signals 'CL1' to 'CL3' is enabled.

The first control signal generating unit 210-7 generates the inverted control signal 'ctrlb' having a lower voltage level when the second operational-speed information signal 'CL2' is enabled as compared with when the first operational-speed information signal 'CL1' is enabled. In addition, the first control signal generating unit 210-7 generates the inverted control signal 'ctrlb' having a lower voltage level when the third operational-speed information signal 'CL3' is enabled as compared with when the second operational-speed information signal 'CL2' is enabled.

As the voltage level of the inverted control signal 'ctrlb' is lowered, a turn-on degree of the first switch 220-7 is increased. As the turn-on degree of the first switch 220-7 is increased, an amount of current flowing to the first voltage node node_v1 is increased.

The second control signal generating unit 230-7 generates the control signal 'ctrl' having a higher voltage level when the second operational-speed information signal 'CL2' is enabled as compared with when the first operational-speed information signal 'CL1' is enabled. In addition, the second control signal generating unit 230-7 generates the control signal 'ctrl' having a higher voltage level when the third operational-speed information signal 'CL3' is enabled as compared with when the second operational-speed information signal 'CL2' is enabled.

As the voltage level of the control signal 'ctrl' is raised, a turn-on degree of the second switch 240-7 is increased. As the turn-on degree of the second switch 240-7 is increased, an amount of current flowing to the second voltage node node_v2 is increased.

As the operational speed of the semiconductor memory apparatus according to another embodiment of the present disclosure is increased, the semiconductor memory apparatus increases an amount of current supplied to the internal circuit 100 and an amount of current flowing from the internal circuit 100 to the line of the ground voltage VSS.

The semiconductor memory apparatus according to another embodiment of the present disclosure controls an amount of current flowing through the internal circuit 100 according to the operational speeds of the semiconductor memory apparatus. Therefore, according to the present disclosure, current consumption can be effectively reduced in the semiconductor memory apparatus.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A semiconductor memory apparatus comprising:
   an internal circuit configured to be driven by current flowing between first and second voltage nodes; and
   a current control unit configured to receive a plurality of operational-speed information signals and control an amount of the current in response to the operational-speed information signals.

2. The semiconductor memory apparatus of claim 1, wherein the current control unit includes a switch configured to apply an external voltage to the first voltage node in response to the operational-speed information signals.

3. The semiconductor memory apparatus of claim 2, wherein the current control unit includes a plurality of transistors having different sizes, and
   wherein the transistors, which are configured to be selectively turned on in response to enabled ones of the operational-speed information signals, are configured to serve as the switch.

4. The semiconductor memory apparatus of claim 2, wherein the current control unit includes a plurality of transistors, and
   wherein a number of the transistors, which are turned on in response to enabled ones of the operational-speed information signals, is increased or decreased to allow the transistors to serve as the switch.

5. The semiconductor memory apparatus of claim 1, wherein the current control unit includes a switch configured to apply a ground voltage to the second voltage node in response to the operational-speed information signals.

6. The semiconductor memory apparatus of claim 5, wherein the current control unit includes a plurality of transistors having different sizes, and
   wherein the transistors, which are configured to be selectively turned on in response to enabled ones of the operational-speed information signals, are configured to serve as the switch.

7. The semiconductor memory apparatus of claim 5, wherein the current control unit includes a plurality of transistors, and
   wherein a number of the transistors, which are configured to be turned on in response to enabled ones of the operational-speed information signals, is configured to be increased or decreased to allow the transistors to serve as the switch.

8. The semiconductor memory apparatus of claim 1, wherein the current control unit includes:
   a control signal generating unit configured to determine a voltage level of a control signal in response to the operational-speed information signals; and
   a switch configured to control the amount of the current in response to the voltage level of the control signal.

9. The semiconductor memory apparatus of claim 8, wherein the control signal generating unit is configured to lower the voltage level of the control signal in response to the operational-speed information signals if an operational speed of the semiconductor memory apparatus is increased, and
   wherein the switch is configured to increase an amount of current flowing to the first voltage node as the voltage level of the control signal is lowered.

10. The semiconductor memory apparatus of claim 8, wherein the control signal generating unit is configured to raise the voltage level of the control signal in response to the operational-speed information signals if an operational speed of the semiconductor memory apparatus is increased, and
   wherein the switch is configured to increase an amount of current flowing to the second voltage node as the voltage level of the control signal is raised.

11. The semiconductor memory apparatus of claim 8, wherein the control signal includes first and second control signals and the control signal generating unit includes first and second control signal generating units,
   wherein the switch includes first and second switches,
   wherein the first control signal generating unit is configured to generate the first control signal having a voltage level, which is configured to be lowered as the operational speed of the semiconductor memory apparatus is increased, in response to the operational-speed information signals,
   wherein the second control signal generating unit is configured to generate the second control signal having a voltage level, which is configured to be raised if the operational speed of the semiconductor memory apparatus is increased, in response to the operational-speed information signals,
   wherein the first switch is configured to increase an amount of current flowing to the first voltage node as the voltage level of the first control signal is lowered, and
   wherein the second switch is configured to increase an amount of current flowing to the second voltage node as the voltage level of the second control signal is raised.

12. A semiconductor memory apparatus comprising:
   an internal circuit configured to be driven by current flowing between first and second voltage nodes; and
   a current control unit configured to control an amount of the current in response to an operational-speed information signal,
   wherein the current control unit includes:
      a current source unit which includes a first switch configured to apply an external voltage to the first voltage node in response to the operational-speed information signal; and
      a current sink unit which includes a second switch configured to apply a ground voltage to the second voltage node in response to the operational-speed information signal.

13. The semiconductor memory apparatus of claim 12, wherein the current source unit includes a plurality of transistors having different sizes, and
   wherein the transistors, which are configured to be selectively turned on in response to the operational-speed information signal, are configured to serve as the first switch.

14. The semiconductor memory apparatus of claim 12, wherein the current sink unit includes a plurality of transistors having different sizes, and
   wherein the transistors, which are configured to be selectively turned on in response to the operational-speed information signal, are configured to serve as the second switch.

15. The semiconductor memory apparatus of claim 12, wherein the current source unit is configured to increase or decrease a number of the transistor serving as the first switch in response to the operational-speed information signal.

16. The semiconductor memory apparatus of claim 12, wherein the current sink unit is configured to increase or decrease a number of the transistor serving as the second switch in response to the operational-speed information signal.

17. A semiconductor memory apparatus comprising:
   an internal circuit configured to operate if a driving voltage is applied through one voltage node; and
   a current control unit including a plurality of transistors having different sizes, and configured to apply the driving voltage to the voltage node by selectively turning on one of the transistors that has a larger size than a previously selected one of the transistors as an operational speed of the semiconductor memory apparatus is increased.

18. The semiconductor memory apparatus of claim 17, wherein the current control unit is configured to select one among the transistors in response to an operational-speed information signal to connect an external voltage terminal to the voltage node.

19. The semiconductor memory apparatus of claim 17, wherein the current control unit is configured to select one among the transistors in response to an operational-speed information signal to connect a ground voltage terminal to the voltage node.

20. The semiconductor memory apparatus of claim 17, wherein the plurality of the transistors include first and second groups,
   wherein the one voltage node includes first and second voltage nodes, and
   wherein the current control unit includes: a current source unit configured to selectively turn on one of the transistors that has a larger size than a previously selected one of the transistors in the first group to connect the first voltage node to an external voltage terminal as the operational speed is increased; and a current sink unit configured to selectively turn on one of the transistors that has a larger size than a previously selected one of the transistors in the second group to connect the second voltage node to a ground voltage terminal as the operational speed is increased.

21. The semiconductor memory apparatus of claim 20, wherein the current source unit in configured to turn on one of the transistors of the first group to connect the first voltage node to the external voltage terminal in response to an operational-speed information signal.

22. The semiconductor memory apparatus of claim 20, wherein the current sink unit in configured to turn on one of the transistors of the second group to connect the second voltage node to the ground voltage terminal in response to an operational-speed information signal.

23. A semiconductor memory apparatus comprising:
   an internal circuit configured to operate if a driving voltage is applied through one voltage node; and
   a current control unit including a plurality of transistors, and configured to apply the driving voltage to the voltage node by increasing a number of transistors that are turned on among the plurality of transistors as an operational speed of the semiconductor memory apparatus is increased.

24. The semiconductor memory apparatus of claim 23, wherein the current control unit is configured to increase the number of the turned-on transistors in response to an operational-speed information signal and allow the turned-on transistors to connect an external voltage terminal to the voltage node.

25. The semiconductor memory apparatus of claim 23, wherein the current control unit is configured to increase the number of the turned-on transistors in response to an operational-speed information signal and allow the turned-on transistors to connect a ground voltage terminal to the voltage node.

26. The semiconductor memory apparatus of claim 23, wherein the plurality of the transistors include first and second groups, wherein the one voltage node includes first and second voltage nodes, and wherein the current control unit includes: a current source unit configured to connect the first voltage node to an external voltage terminal by increasing a number of transistors that are turned on among the transistors in the first group as the operational speed is increased; and a current sink unit configured to connect the second voltage node to a ground voltage terminal by increasing a number of transistors that are turned on among the transistors in the second group as the operational speed is increased.

27. The semiconductor memory apparatus of claim 26, wherein the current source unit is configured to increase the number of the turned-on transistors among the transistors of the first group in response to an operational-speed information signal, and allow the turned-on transistors to connect the first voltage node to the external voltage terminal.

28. The semiconductor memory apparatus of claim 26, wherein the current sink unit is configured to increase the number of the turned-on transistors among the transistors of the second group in response to an operational-speed information signal and allow the turned-on transistors to connect the second voltage node to the ground voltage terminal.

29. A semiconductor memory apparatus comprising:

an internal circuit configured to operate by current flowing through one voltage node;

a control signal generating unit configured to determine a voltage level of a control signal in response to an operational speed of the semiconductor memory apparatus; and a switch configured to control an amount of the current in response to the voltage level of the control signal.

30. The semiconductor memory apparatus of claim 29, wherein the control signal generating unit is configured to lower the voltage level of the control signal in response to an operational-speed information signal as the operational speed is increased, and wherein the switch is a transistor configured to increase the amount of the current as the voltage level of the control signal is lowered.

31. The semiconductor memory apparatus of claim 29, wherein the control signal generating unit is configured to raise the voltage level of the control signal in response to an operational-speed information signal as the operational speed is increased, and wherein the switch is a transistor configured to increase the amount of the current as the voltage level of the control signal is raised.

32. The semiconductor memory apparatus of claim 29, wherein the voltage node includes a first voltage node connected to an external voltage terminal and a second voltage node connected to a ground voltage terminal, wherein the control signal generating unit includes first and second control signal generating units and the switch includes first and second switches, wherein the control signal includes first and second signals, wherein the first control signal generating unit is configured to lower a voltage level of the first control signal in response to an operational-speed information signal as the operational speed is increased, wherein the first switch is a transistor configured to increase an amount of current flowing to the first voltage node as the voltage level of the first control signal is lowered, wherein the second control signal generating unit is configured to raise a voltage level of the second control signal in response to the operational-speed information signal as the operational speed is increased, and wherein the second switch is a transistor configured to increase an amount of current flowing to the second voltage node as the voltage level of the second control signal is raised.

* * * * *